US012787496B2

(12) United States Patent
David et al.

(10) Patent No.: US 12,787,496 B2
(45) Date of Patent: Nov. 3, 2026

(54) LOW-DEFECT OPTOELECTRONIC DEVICES GROWN BY MBE AND OTHER TECHNIQUES

(71) Applicant: GOOGLE LLC, Mountain View, CA (US)

(72) Inventors: Aurelien Jean Francois David, San Francisco, CA (US); Nicolas Grandjean, Préverenges (CH); Camille Haller, Yverdon-les-Bains (CH); Jean-François Carlin, St-Sulpice VD (CH); Sebastian Pascal Tamariz Kaufmann, Antibes (FR)

(73) Assignee: GOOGLE LLC, Mountain View, CA (US)

( * ) Notice: Subject to any disclaimer, the term of this patent is extended or adjusted under 35 U.S.C. 154(b) by 960 days.

(21) Appl. No.: 18/001,823

(22) PCT Filed: Jun. 15, 2021

(86) PCT No.: PCT/US2021/070711
§ 371 (c)(1),
(2) Date: Dec. 14, 2022

(87) PCT Pub. No.: WO2021/258103
PCT Pub. Date: Dec. 23, 2021

(65) Prior Publication Data

US 2023/0238478 A1 Jul. 27, 2023

Related U.S. Application Data

(60) Provisional application No. 63/200,687, filed on Mar. 22, 2021, provisional application No. 63/198,345,
(Continued)

(51) Int. Cl.
*H10H 20/812* (2025.01)
*H10H 20/01* (2025.01)

(52) U.S. Cl.
CPC .......... *H10H 20/812* (2025.01); *H10H 20/01* (2025.01); *H10H 20/0137* (2025.01)

(58) Field of Classification Search
CPC ...................................................... H10H 20/01
See application file for complete search history.

(56) References Cited

U.S. PATENT DOCUMENTS 7,179,329 B2 2/2007 Boone et al.
8,994,000 B2 3/2015 Avramescu et al.
(Continued)

FOREIGN PATENT DOCUMENTS

CN 100359638 C 1/2008
EP 2348548 A2 7/2011
(Continued)

OTHER PUBLICATIONS

International Search Report and Written Opinion for PCT Application No. PCT/US2021/070711, mailed on May 20, 2022, 18 pages.
(Continued)

*Primary Examiner* — Leonard Chang
*Assistant Examiner* — Hajar Kolahdouzan
(74) *Attorney, Agent, or Firm* — BRAKE HUGHES BELLERMANN LLP

(57) ABSTRACT

In a general aspect, a method for growing an InGaN optoelectronic in a reaction chamber, by MOCVD, includes controlling a surface temperature of a wafer to be at least 750° C. during growth of a light-emitting layer. The light emitting layer includes an InGaN quantum well layer having an In % of greater than 25%. The method further includes providing an indium-containing metalorganic precursor and a gallium-containing metalorganic precursor into the reaction chamber and to the wafer during growth of the light-emitting layer when the surface temperature of the wafer is greater than 750° C. The method also includes providing an
(Continued)

N-containing species to the wafer at a rate such that a partial pressure of the N-containing species at the surface of the wafer is greater than 1.5 atmospheres during growth of the light-emitting layer of the optoelectronic device when the surface temperature of the wafer is greater than 750° C.

21 Claims, 29 Drawing Sheets

Related U.S. Application Data filed on Oct. 12, 2020, provisional application No. 62/706,961, filed on Sep. 21, 2020, provisional application No. 62/705,186, filed on Jun. 15, 2020.

(56) References Cited

U.S. PATENT DOCUMENTS

| | | | | |
|---|---|---|---|---|
| 9,093,820 | B1 | 7/2015 | Raring et al. | |
| 11,339,500 | B2 | 5/2022 | Horikiri et al. | |
| 2009/0309127 | A1* | 12/2009 | Raring | B82Y 10/00 117/106 |
| 2010/0150194 | A1 | 6/2010 | Tsuchiya et al. | |
| 2010/0163931 | A1 | 7/2010 | Fujioka et al. | |
| 2010/0187496 | A1 | 7/2010 | Yan | |
| 2010/0320441 | A1 | 12/2010 | Lee | |
| 2012/0000415 | A1 | 1/2012 | D et al. | |
| 2012/0204957 | A1 | 8/2012 | Nicholls et al. | |
| 2013/0126939 | A1* | 5/2013 | Ishikawa | H10K 59/873 118/620 |
| 2014/0103289 | A1 | 4/2014 | Liao et al. | |
| 2015/0132926 | A1* | 5/2015 | D'Evelyn | C30B 7/105 125/30.01 |
| 2018/0047868 | A1 | 2/2018 | David et al. | |

FOREIGN PATENT DOCUMENTS

| | | | |
|---|---|---|---|
| JP | H1174203 | A | 3/1999 |
| JP | 2001068791 | A | 3/2001 |
| JP | 2001148510 | A | 5/2001 |
| JP | 2002359439 | A | 12/2002 |
| JP | 2003055656 | A | 2/2003 |
| JP | 2010077022 | A | 4/2010 |
| JP | 2011155241 | A | 8/2011 |
| JP | 2012248850 | A | 12/2012 |
| JP | 2013201459 | A | 10/2013 |
| JP | 2017154964 | A | 9/2017 |
| JP | 2018199601 | A | 12/2018 |
| KR | 20130092829 | A | 8/2013 |
| TW | 201507196 | A | 2/2015 |
| WO | 2005112123 | A2 | 11/2005 |

OTHER PUBLICATIONS

ALAM, "High Indium Concentration Ingan Multi-Quantum-Well-Based Blue-Green Light-Emitting Diodes Grown on INGAN "Semi-Bulk" Buffer", HAL archives-ouvertes, Jun. 6, 2018, 189 pages.

* cited by examiner

LOW-DEFECT OPTOELECTRONIC DEVICES GROWN BY MBE AND OTHER TECHNIQUES

CROSS REFERENCE TO RELATED APPLICATIONS

This application is a 35 U.S.C. § 371 National Phase Entry Application from PCT/US2021/070711, filed Jun. 15, 2021, designating the U.S. and claims the benefit of U.S. Provisional Application No. 62/705,186, filed Jun. 15, 2020, U.S. Provisional Application No. 62/706,961, filed Sep. 21, 2020, U.S. Provisional Application No. 63/198,345, filed Oct. 12, 2020 and U.S. Provisional Application No. 63/200,687, filed Mar. 22, 2021, the disclosures of which are incorporated herein by reference in their entireties.

TECHNICAL FIELD

This document relates generally to optoelectronic devices and techniques for fabricating optoelectronic devices with low numbers of defects.

BACKGROUND

Semiconductor optoelectronic devices, such as lasers and light emitting diodes (LEDs), that convert electrical energy to optical energy are ubiquitous in the modern world and are known for their efficiency in converting electrical energy into light energy. However, some Group III-nitride optoelectronic devices suffer from insufficient conversion efficiency. For example, red optoelectronic devices are generally less efficient than blue or green LEDs. Furthermore, optoelectronic devices grown with some techniques such as molecular beam epitaxy (MBE) may be relatively inefficient.

SUMMARY

This disclosure describes techniques that improve the conversion efficiency of optoelectronic devices (i.e., the efficiency of converting electrical energy into light energy), including techniques for improving the conversion efficiency of optoelectronic devices grown by MBE, including long-wavelength optoelectronic devices. Implementations include optoelectronic devices and or methods of making optoelectronic devices. The optoelectronic devices are characterized by their structure that leads to high efficiency. Implementations include epitaxy reactors and methods of using epitaxy reactors to make efficient optoelectronic devices.

Reference is at times made herein to MBE epitaxy. However, techniques described herein can be applied to other growth techniques, including metalorganic chemical vapor deposition (MOCVD), plasma-enhanced epitaxy, sputtering, hydride vapor phase epitaxy (HYPE), pulsed layer deposition, and combinations of these various techniques.

In a first general aspect, a method of growing an optoelectronic device by molecular beam epitaxy (MBE) includes providing a substrate in an MBE growth chamber, growing on the substrate an n-doped layer, a p-doped layer, and a light-emitting layer between the n-doped layer and the p-doped layer, and controlling the growing such that the light-emitting layer includes a plurality of In-containing quantum well layers having an In content greater than 20%, a plurality of In-containing barrier layers having an In content greater than 1%, and does not include any GaN barriers, where growing the light-emitting layer includes alternately growing the quantum well layers and the barrier layers, and such that the quantum well layers have a density of defects of less than $5\times10^{15}$ per $cm^3$.

Implementations can include one or more of the following features, alone or in any combination with each other.

For example, the quantum well layers can have an optical band gap ($E_o$) and defects have energies within +/−300 meV of $E_o/2$.

In another example, the defects can cause Shockley-Read-Hall recombinations in the quantum well layers.

In another example, the defects can include a nitrogen vacancy.

In another example, the defects can include a gallium-nitrogen divacancy.

In another example, growing the light-emitting region can include growing the quantum well layers and the barrier layers at a growth temperature of less than 550° C.

In another example, growing the light-emitting region can include growing the quantum well layers and the barrier layers at a growth temperature of less than 500° C.

In another example, growing the light-emitting region can include growing the quantum well layers and the barrier layers at a growth temperature of greater than 550° C. with a nitrogen flux at the substrate of greater than $1\times10^{15}$ atoms per $cm^2$ per second.

In another example, growing the light-emitting region can include providing to the substrate a nitrogen flux and a flux of group III species in a ratio of the nitrogen flux to the flux of group III species of at least 5.

In another example, the optoelectronic device can be one of an LED or a laser diode.

In another example, growing the light-emitting region can include providing a nitrogen plasma to the wafer from a plurality of different nitrogen cells, from a distance between each nitrogen cell and the wafer of less than 50 cm, where the provided nitrogen plasma has a beam equivalent pressure of N adatoms above $1\times10^{-5}$ Torr at the wafer.

In another example, growing the light-emitting region can include providing a nitrogen plasma to the wafer from a plurality of different nitrogen cells, from a distance between each nitrogen cell and the wafer of less than 50 cm, where a flux of nitrogen species on the wafer provided by the nitrogen plasma is above $2\times10^{15}$ atoms per $cm^2$ per second.

In another example, a contrast ratio of the flux of nitrogen species on the wafer can be less than 0.1.

In another example, providing the nitrogen plasma can include providing an $N_2$ flux to provide for the plasma and maintaining the plasma with an electrical power that is less than three times a minimum electrical power necessary to ignite the plasma.

In another example, the method can further include growing at least one first barrier layer under In-rich conditions, the barrier layer having an In content in a range 0.1% to 10%, and growing at least one quantum well layer directly above the first barrier layer under In-rich conditions, the quantum well layer having an In content in a range 10% to 50%, where, during a transition between growing the at least one first barrier layer and growing the at least one quantum well layer, In is provided to the wafer and the nitrogen plasma is active.

In another example, the optoelectronic device can have an internal quantum efficiency of at least 10%.

In another example, a vacuum can be created in the reaction chamber having a hydrogen partial pressure of less than $5\times10^{-11}$ Torr during growth of the n-doped layer, the p-doped layer, and the light-emitting layer and wherein controlling the growing includes controlling the growing such that one or more of the quantum well layers has a hydrogen concentration of less than $1\times10^{18}$ per cubic centimeter.

In another general aspect, an MBE apparatus for growing an optoelectronic device that includes an n-doped layer, a p-doped layer, and a light-emitting layer between the n-doped layer and the p-doped layer is disclosed, where the apparatus includes a reaction chamber, a wafer holder in the reaction chamber configured to hold a wafer in place during growth of the optoelectronic device, a plurality of group III cells configured for providing a group III species to a wafer held by the wafer holder, where each group III cell provides the group III species to the wafer from a different direction, and a plurality of nitrogen plasma cells configured for providing nitrogen plasma to the wafer held by the wafer holder, where each nitrogen plasma cell provides the nitrogen plasma to the wafer from a different direction and from a distance between an outlet of the cell to the wafer of less than 50 cm, and where the plurality of nitrogen plasma cells are configured to produce a nitrogen flux on the wafer greater than $2\times10^{15}$ atoms per $cm^2$ per second.

Implementations can include one or more of the following features, alone or in any combination with each other.

For example, the plurality of nitrogen plasma cells can be configured to produce a pressure of nitrogen adatoms greater than $1\times10^{-5}$ Torr at the wafer.

In another example, the plurality of nitrogen plasma cells can be configured to produce a contrast ratio of the flux of nitrogen on the wafer of less than 0.1.

In another example, the plurality of nitrogen plasma cells can be configured to provide an $N_2$ flux to provide for the nitrogen plasma and to maintain the plasma with an electrical power that is less than three times a minimum electrical power necessary to ignite the plasma.

In another example, the plurality of group III cells and the plurality of nitrogen plasma cells can be configured to provide to the wafer a nitrogen flux and a flux of group III species in a ratio of the nitrogen flux to the flux of group III species of at least 5.

In another example, the reaction chamber can have a characteristic height and a characteristic length that is greater than the characteristic height.

In another example, the apparatus can also include one or more vacuum pumps operable connected to the reaction chamber and configured to create a vacuum having a hydrogen partial pressure in the reaction chamber of less than $5\times10^{-11}$ Torr during growth of the optoelectronic device.

In another general aspect, an MOCVD apparatus for growing an optoelectronic device that includes an n-doped layer, a p-doped layer, and a light-emitting layer between the n-doped layer and the p-doped layer is disclosed, where the apparatus includes a reaction chamber, a wafer holder in the reaction chamber configured to hold a wafer in place during growth of the optoelectronic device, a plurality of group III cells configured for an indium-containing metalorganic precursor and a gallium-containing metalorganic precursor to a wafer held by the wafer holder, and an ammonia cell configured for providing ammonia to the wafer held by the wafer holder, where the group III cells and the ammonia cell are configured for providing the indium-containing metalorganic precursor, gallium-containing metalorganic precursor and the ammonia into the reaction chamber at rates sufficient for generating a total pressure in the reaction chamber of greater than two atmospheres when the optoelectronic device is grown.

Implementations can include one or more of the following features, alone or in any combination with each other.

For example, the apparatus can also include an exhaust chamber coupled to the reaction chamber and configured to maintain a total pressure in the reaction chamber above a predetermined value.

In another example, the ammonia cell can be configured to provide the ammonia to the reaction chamber in a liquid phase.

In another general aspect, a method is provided for growing in a MOCVD reaction chamber an InGaN optoelectronic device that includes an n-doped layer, a p-doped layer, and a light-emitting layer between the n-doped layer and the p-doped layer, the light emitting layer including an InGaN quantum well layer having an In % of greater than 35%. The method includes controlling a surface temperature of a wafer on which the InGaN optoelectronic device is grown where the surface temperature is at least 750° C. during growth of the light-emitting layer of the optoelectronic device, providing an indium-containing metalorganic precursor and a gallium-containing metalorganic precursor into the reaction chamber and to the wafer during growth of the light-emitting layer of the optoelectronic device when the surface temperature of the wafer is greater than 750° C., and providing an N-containing species to the wafer at a rate such that a partial pressure of the N-containing species at the surface of the wafer is greater than 1.5 atmospheres during growth of the light-emitting layer of the optoelectronic device when the surface temperature of the wafer is greater than 750° C., where the indium-containing metalorganic precursor, the gallium-containing metalorganic precursor, and the N-containing species are provided into the reaction chamber at rates sufficient for generating a total pressure in the reaction chamber of greater than two atmospheres during growth of the light-emitting layer of the optoelectronic device.

Implementations can include one or more of the following features, alone or in any combination with each other.

For example, an exhaust of gases through an exhaust chamber that is coupled to the reaction chamber can be metered to maintain a total pressure in the reaction chamber above a predetermined value that is greater than two atmospheres.

In another example, providing the N-containing species to the reaction chamber can include providing ammonia to the reaction chamber at a temperature of less than 600° C.

In another example, providing the N-containing species to the reaction chamber can include providing ammonia to the reaction chamber in a liquid phase.

In another example, providing the N-containing species to the reaction chamber can include providing the liquid phase ammonia to the reaction chamber at a temperature of less than 200° C.

In another example, the light-emitting layer can be configured to emit light at a wavelength longer than 600 nm with an internal quantum efficiency higher than 20%.

In another example, the light-emitting layer can be configured to emit light at a wavelength longer than 600 nm with an internal quantum efficiency higher than 20% when driven with a current density higher than 1 $A/cm^2$.

In another example, the N-containing species can be provided such that it forms a boundary layer over the wafer, and the partial pressure of the N-containing species can be over 1.5 atmospheres in the boundary layer.

In another example, at least two of the indium-containing precursor, the gallium-containing precursor, and the N-containing species can be provided at separate times during the growth of the light-emitting layer of the optoelectronic device.

In another example, at least two of the indium-containing precursor, the gallium-containing precursor, and the N-containing species can be provided at separate locations in the chamber.

In another example, an optoelectronic device can be grown by any of the methods of claims 28-37.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily drawn to scale and may not be in scale relative to each other. Like reference numerals designate corresponding parts throughout the several views.

DETAILED DESCRIPTION

This disclosure describes techniques for fabricating efficient Group III-nitride optoelectronic devices, for example, optoelectronic devices that are grown by MBE. For convenience, reference is made herein to LEDs and techniques for fabricating LEDs, but the techniques are applicable optoelectronic devices generally, including laser diodes, LEDs, etc.

Figure 1:
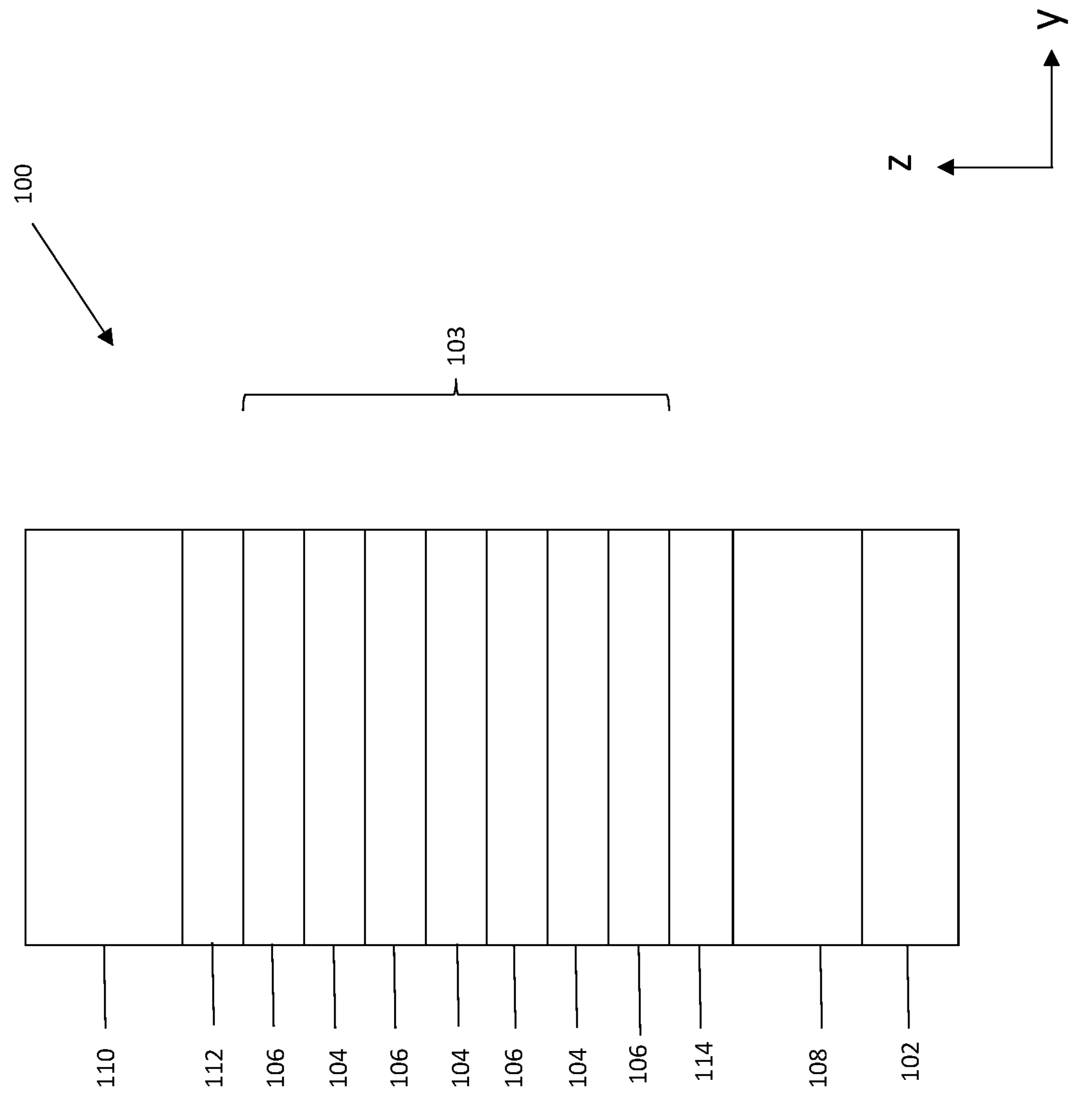
FIG. 1 is a schematic diagram of a semiconductor layer structure (or a layer stack) of a Group III-nitride LED. The LED includes a number of semiconductor layers that are epitaxially grown (e.g., through MOCVD, MBE, etc.) on a substrate in a z-direction from the substrate.

FIG. 1 is a schematic diagram of a semiconductor layer structure (or a layer stack) of a Group III-nitride LED 100. The LED includes a number of semiconductor layers that are epitaxially grown (e.g., through MOCVD, MBE, etc.) on a substrate 102 in a z-direction from the substrate. For example, the layers can include a light emitting region 103 (also known as an active region) that includes a plurality of quantum well layers 104 and barrier layers 106. An n-doped waveguide layer 108 and a p-doped waveguide layer 110 can be disposed on opposite sides of the light emitting region. An electron blocking layer 112 can be disposed between the light emitting region 103 and the p-doped waveguide layer 110. An underlayer 114 can be included in the layer stack between the light emitting region 103 and the n-doped waveguide layer 108.

Electrons can be supplied to the light emitting region 103 through the n-doped waveguide layer 108, and holes can be supplied to the light emitting region 103 through the p-doped waveguide layer 110. Recombination of the electrons and holes in the quantum well layers 104 can result in the generation of light due to radiative recombinations. Light generated in the light emitting region can be confined by the waveguide layers 108, 110, which have lower indices of refraction than the light emitting region, so that light is emitted from an edge of the LED 100 in a y-direction from the light emitting region 103.

The quantum wells 104 and barriers 106 of light emitting region 103 can include indium and nitrogen (e.g., InGaN or AlInN or AlInGaN), with different proportions of the constituent materials in the wells and barriers. In one implementation, InGaN barriers can include about 2% indium (i.e., In %=2%) and InGaN wells can include about 30% indium (i.e., In %=30%). More complex epitaxial structures also are possible. For example, the barrier layers may include more complex multi-layer barriers, whose compositions vary within the barrier layer. In one implementation, the barrier layers may include AlInN layers, or other layers, configured to modify the strain of the crystal structure of the layer stack. In some cases, a barrier layer can compensate for the compressive strain caused by the In-containing light-emitting layer, because the strain influences the incorporation of defects into the layer stack, and, therefore, the composition of the barrier layers can be selected to reduce the defect density.

A variety of light emitting region 103 structures, for example, including quantum wells of various thickness (e.g., in a range 1-10 nm) and numbers (e.g., in a range 1-20), having double-heterostructures (e.g., with a thickness in a range 10-100 nm), and having layers with varying composition (e.g., with a step profile or a graded profile). In addition, barrier layers and/or a light-emitting layer may have a different In content than those specifically provided as examples herein.

For clarity, the In % values used herein to describe the composition of a layer are average percentages for compositions across the layer. For example, the InGaN underlayer 114 may be formed as an InGaN/InGaN superlatttice, and a value of In>2% refers to the composition averaged across the superlattice layers. The percentages pertain to the relative composition of group-III elements (e.g., Al, Ga, In) in a layer. For example, InGaN with In %=10% corresponds to $In_{0.1}Ga_{0.9}N$.

Figure 2:
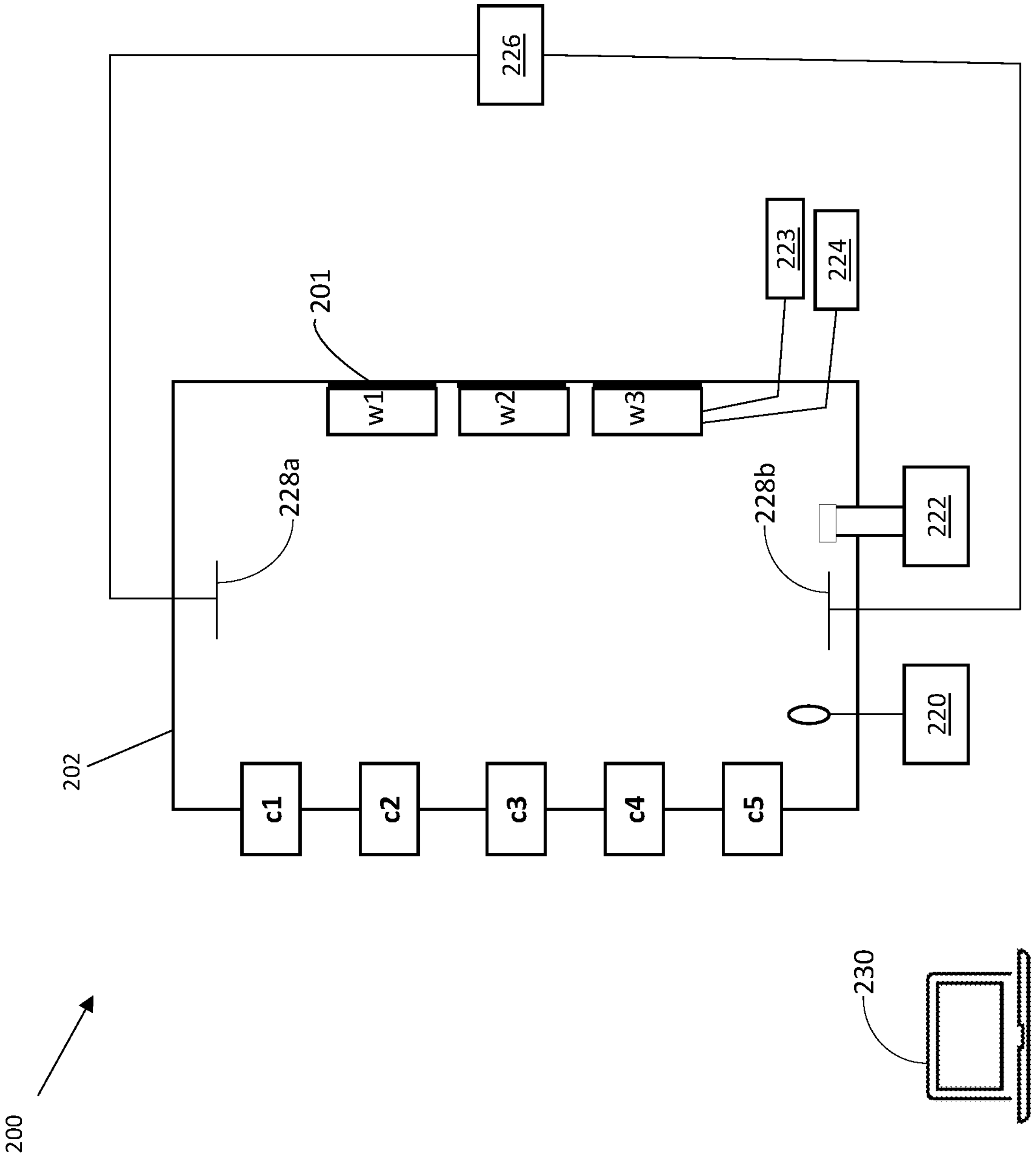
FIG. 2 is a schematic diagram of a system for growing LEDs epitaxially.

FIG. 2 is a schematic diagram of a system 200 for growing LEDs epitaxially. The system 200 includes a vacuum chamber 202 (also known as a growth chamber) and one or more wafers w1, w2, w3 that provide substrates on which semiconductor layers are grown. The system 200 can include one or more wafer holders 201 configured to hold a wafer in place during epitaxial growth. Cells c1, c2, c3, c4, c5 provide materials (e.g., gallium, indium, aluminum, nitrogen, hydrogen, etc.) that are deposited, for example, through MBE, on the wafers w1, w2, w3 and/or on layers previously grown on the wafers to create the semiconductor layers of the LEDs. Cell c1, c2, c3, c4, c5 can include a valve to control the flow of material from the cell into the vacuum chamber 202 and can include a shutter to close off the flow of all material from the cell to the vacuum chamber 202.

The system 200 can include one or more vacuum pumps 222 operationally connected to the vacuum chamber 202 and configured to maintain a low-pressure vacuum in the chamber 202. The vacuum pumps 222 can include, for example, a turbopump, a cryopump, an ion getter pump, titanium sublimation pump, etc. The system 200 can include one or more pressure sensors 220 configured to measure a pressure in the vacuum chamber 202, where the measured pressure can be used to determine a flux of material from one or more cells c1, c2, c3, c4, c5, which is deposited on the wafers w1, w2, w3. The system 200 can include one or more heaters 223 configured to heat a wafer w1, w2, w3 to a predetermined temperature and one or more temperature sensors 224 to determine a temperature of the wafer(s) w1, w2, w3, on which the semiconductor layer stack is grown. The system 200 can include one or more AC (e.g., radio frequency) or DC high-voltage sources 226 electrically connected to one or more electrodes **228*a*, 228*b* that are configured to generate a plasma of materials emitted from one or more of the cells c1, c2, c3, c4, c5 within the vacuum chamber 202. The electrodes 228*a*, 228*b* that generate the plasma can located within a cell c1, c2, c3, c4, c5 and/or exterior to a cell c1, c2, c3, c4, c5 within the chamber 202. The system can include a controller 230 that includes a memory storing machine-executable instructions and a processor configured to execute the stored instructions, where the execution of the instructions causes the controller 230 to control the operation of one or more other elements of the system 200. For example, the controller 230 can control the flow rate of material from the cells c1, c2, c3, c4, c5 to a wafer w1, w2, w3, can control a temperature of 224**, can control the electrical power applied to electrodes to create a plasma of material, etc.

As described herein, judicious control of parameters when epitaxially growing LEDs with MBE (e.g., control of the flux of certain materials from the cells onto the wafers, control of the relative amounts of different materials that are provided to the wafers, control of the parameters of the plasma in the vacuum chamber, control of the temperature of the epitaxial growth, control of the geometry of the MBE system, control of the timing of the flux of different materials used to create the different layers) can be used to grow LEDs that have superior efficiencies.

Conventionally, MBE growth of LEDs is known to result in LEDs having relatively poor efficiency, for example, with a wall plug efficiency (WPE) of up to a few percent, where the WPE is a metric of the efficiency with the LED converts electrical power into optical power. The WPE can be expressed as a ratio of the radiant optical flux from LED (i.e., the total radiometric optical output power of the LED, measured in Watts) and the electrical power (also measured in Watts) input to the LED to drive the optical output. In contrast, the techniques described herein may provide for MBE-grown LEDs having a significantly higher WPE (e.g., above 30% 40%, 50%, 60%, 70%).

Inefficiency of an LED may be due to a specific class of defects in the semiconductor structure of the LED, and techniques are described herein to fabricate LED structures with lower defect densities and therefore higher efficiencies. A defect may suppress efficiency by various mechanisms, such as, for example, causing non-radiative Shockley-Read-Hall recombinations, causing trap-assisted tunneling, inducing defect-assisted droop (including defect-assisted Auger recombination), etc.

A defect may be characterized by its energy, measured, for example, by deep level optical spectroscopy (DLOS). The defect may have an energy that is approximately in the middle of the gap of the LED's light emitting layer—for example, for a blue-emitting indium-gallium-nitride (InGaN) quantum well (QW) that includes about 13% Indium ([In]=13%), the DLOS energy may be about 1.6 eV.

The defect may further be characterized by a defect concentration that varies across a light-emitting InGaN layer, which may occur because the defect is efficiently integrated during InGaN growth, thus reducing the available defect density as the growth proceeds. In some implementations, an InGaN layer can have a defect density that follows a decreasing exponential profile along the growth direction. The exponential profile may be characterized by a decay length between 1 nm and 100 nm.

A defect also may be characterized by its chemical structure. For example, a defect may be associated with intrinsic defects, including nitrogen vacancies (VN) and/or Gallium vacancies (VGa) in the layer stack. In particular, a defect may be tied to a divacancy involving nitrogen and a group III element ($V_{III\text{-}N}$). Examples include a gallium-nitrogen divacancy ($V_{Ga—N}$) and an indium-nitrogen divacancy ($V_{In—N}$). A defect may include the divacancy itself, or a defect based on the divacancy (such as an interstitial at the divacancy). Interstitial species may include metallic atoms. The defect may be a complex combining a vacancy and an impurity (such as carbon, oxygen, hydrogen, metals).

In an LED, a plurality of defects that may include, for example, one or more of the above characteristics may jointly contribute to conversion efficiency reduction in the LED. As described herein, implementations provide improved conversion efficiency in an LED by fabricating the LED with a reduced defect density.

In some implementations of the techniques described herein, the defect density can be lower than a predetermined threshold value.

Figure 3:
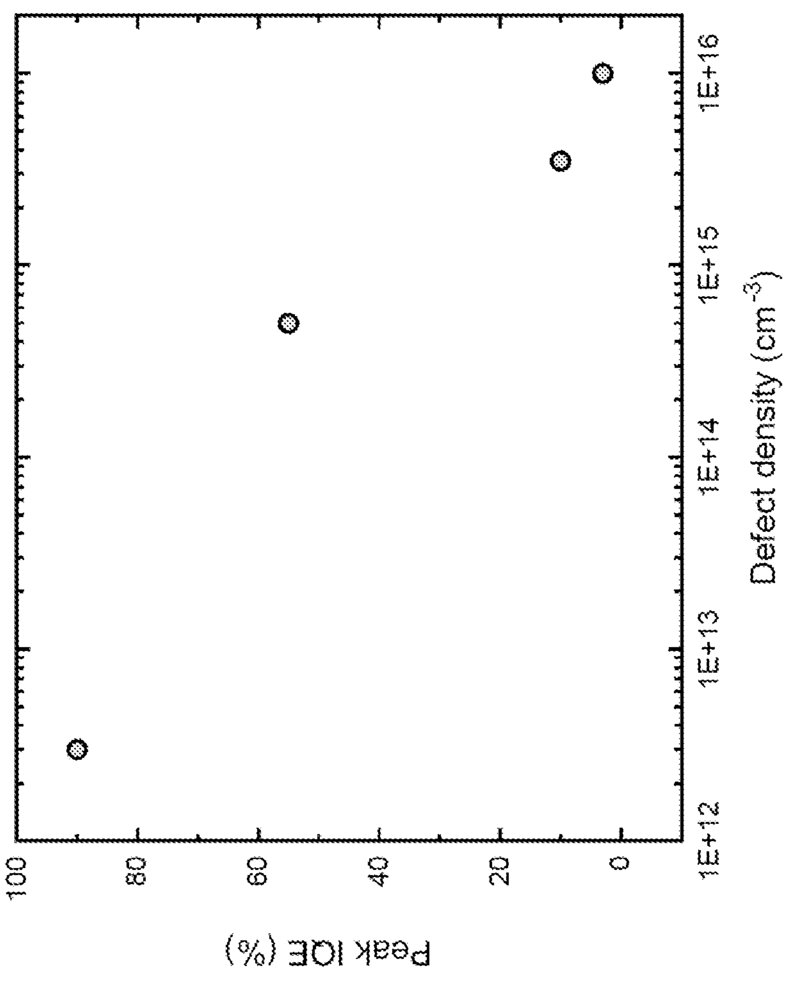
FIG. 3 is a graph of an example experimental relationship between defect density on the horizontal axis and conversion efficiency on the vertical axis of InGaN LEDs grown by MOCVD.
Figure 4:
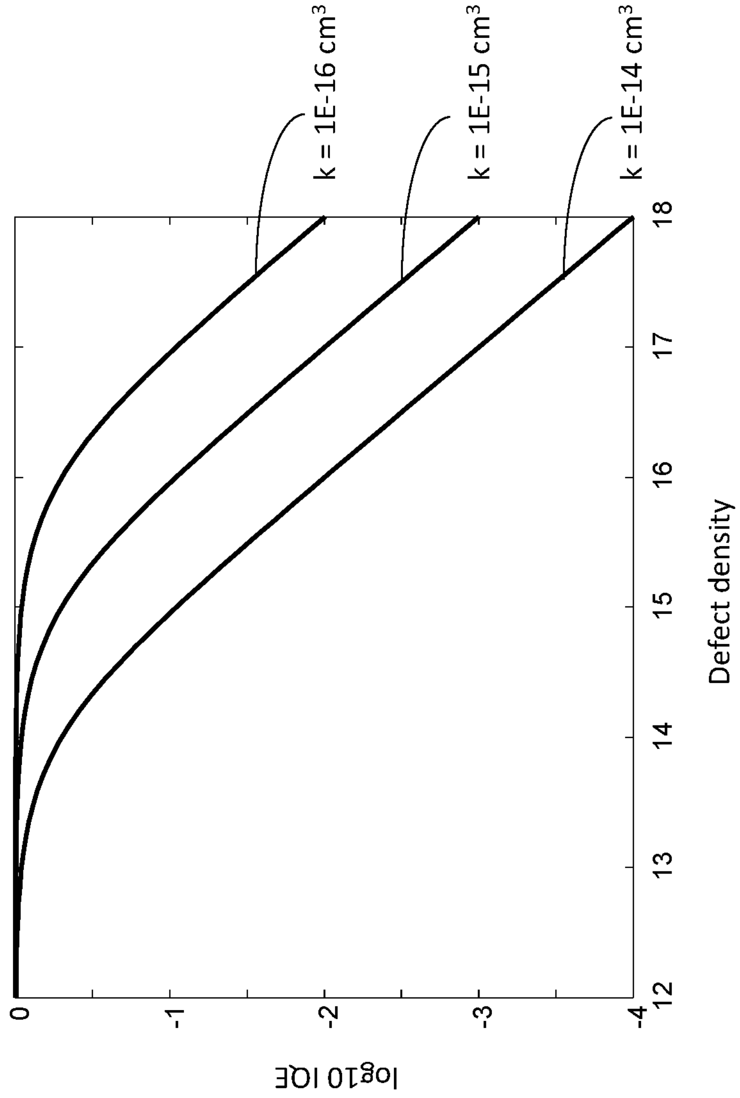
FIG. 4 is a graph of a relationship between a lower bound of the IQE of an LED and the defect density of the LED.
Figure 5:
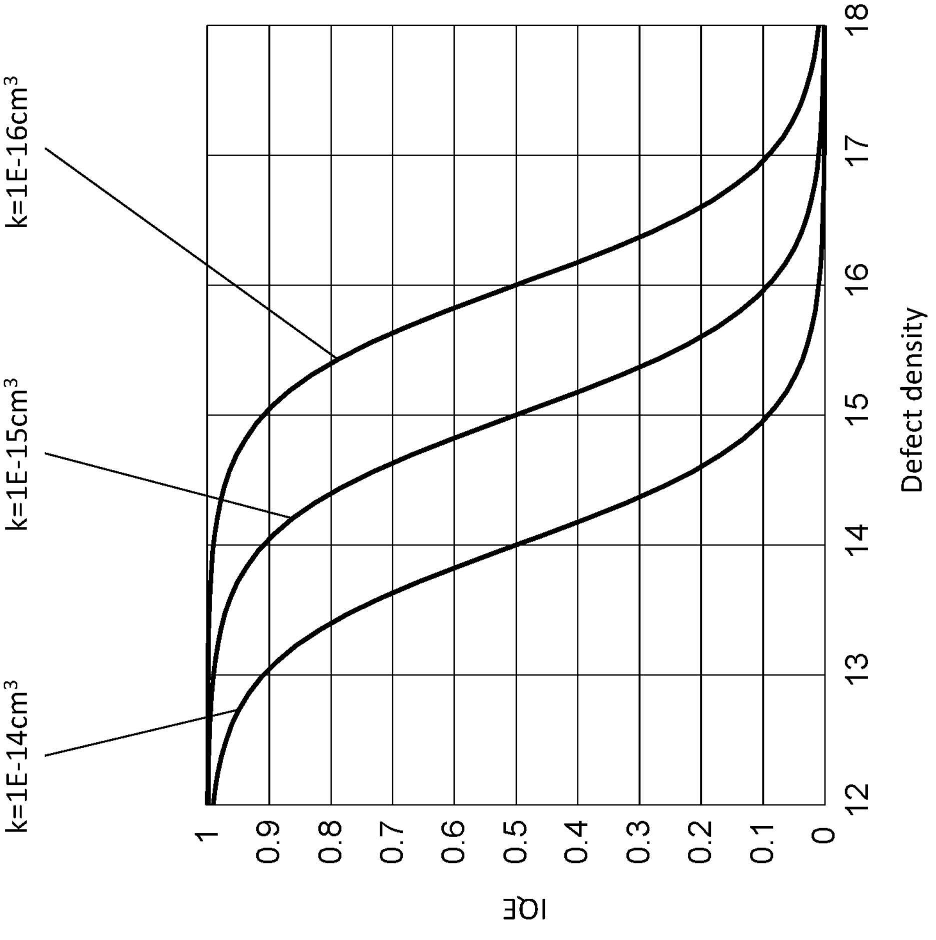
FIG. 5 is a graph of a relationship between a lower bound of the IQE of an LED and the defect density of the LED with a linear scale for IQE.

FIG. 3 is a graph of an example experimental relationship between defect density on the horizontal axis and conversion efficiency on the vertical axis of InGaN LEDs grown by MOCVD. The conversion efficiency is expressed in terms of internal quantum efficiency (IQE), where the IQE is defined as the ratio of number radiative recombinations ($R_r$) in the LED to the total number of recombinations, i.e., the sum of radiative and non-radiative ($R_{nr}$) combinations in the LED:

$$IQE = \frac{R_r}{R_r + R_{nr}} \qquad (1)$$

The point at the lowest density in the graph of FIG. 3 is obtained by cathodoluminescence, and the other points are obtained by DLOS. As seen from FIG. 3, defects may limit efficiency of the LED, and similarly it can be expected that MBE-grown LEDs with similar defect densities would achieve a similar efficiencies.

In some implementations, the LED has at least one light-emitting layer that includes indium and nitrogen (e.g., the light emitting layer can include InGaN or AlInN or AlInGaN). The light-emitting layer can be characterized by a total density of defects located around mid-gap, which is less than $10^{15}$ defects per cubic centimeter, or less than $5\times10^{15}$ per cubic centimeter or less than $5\times10^{14}$ per cubic centimeter or less than $10^{14}$ per cubic centimeter. The LED may be characterized by a defect density D and an IQE, and D and IQE may be approximately related by:

$$IQE = 1/(1+kD), \qquad (2)$$

where D is expressed in $cm^{-3}$ and k parameterizes the defect activity (a larger value of k corresponds to a more active defect). In some implementations, k can be approximately equal to $3\times10^{-14}$ $cm^3$ or $1\times10^{-14}$ $cm^3$ or $3\times10^{-15}$ $cm^3$ or $1\times10^{-15}$ $cm^3$ or $1\times10^{-16}$ $cm^3$. This model is, for example, representative of the IQE of an LED operated at low-to-moderate current density, where the IQE results from a trade-off between radiative recombination and defect-driven recombination.

For clarity, 'around mid-gap' describes defects having a defect energy, $E_d$, that is substantially equal to the half the bandgap of the light emitting layer, $E_g$. Thus, in some implementations, $$E_d = E_g/2 \pm \Delta E, \qquad (3)$$

where ΔE represents a tolerance on the energy. In some implementations, ΔE may be approximately equal to 300 meV (or 50 meV, 100 meV, 200 meV, 500 meV). The band gap, $E_g$, may be difficult to evaluate directly, and, therefore, in equation (3) above, a related quantity, such as the optical band gap of the light-emitting layer $E_o$ or the peak energy of emission $E_p$ can be used as a proxy for $E_g$.

Figure 6A:
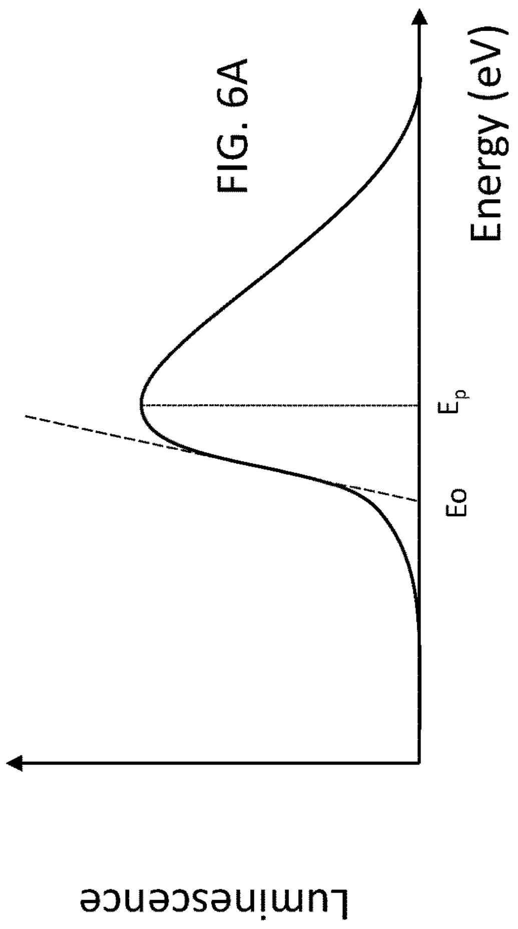
FIG. 6A is graph of an example spectrum of light emitted from an LED showing a relationship between the luminance from an LED on the vertical axis and the energy of the luminance on the horizontal axis.

FIG. 6A is graph of an example spectrum of light emitted from an LED showing a relationship between the luminance from an LED on the vertical axis and the energy of the luminance on the horizontal axis. The peak energy, $E_p$, at which highest luminance is emitted is shown in FIG. 6A. The optical band gap $E_o$ can be estimated from the low-energy tail of the luminescence spectrum of the LED, where $E_o$ is the horizontal axis intercept of a tangent to the low-energy tail of the spectrum, as shown in FIG. 6A.

Figure 6B:
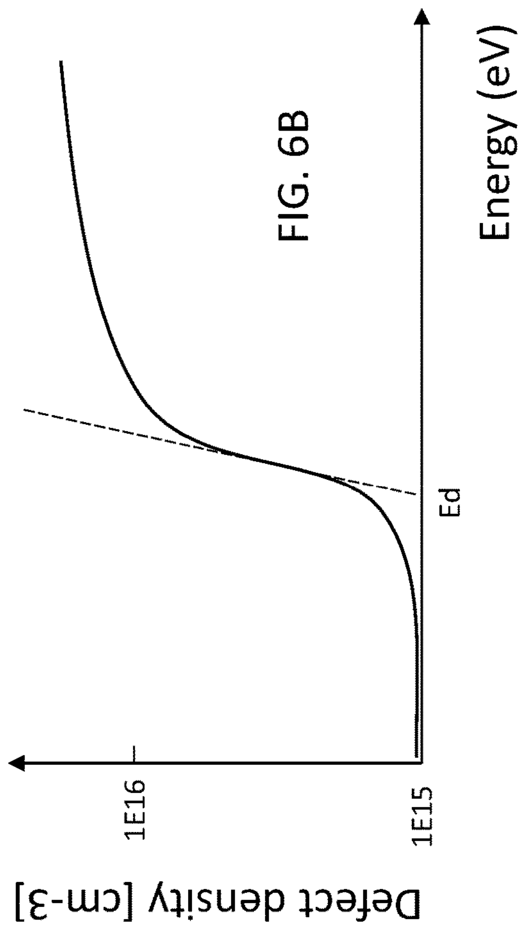
FIG. 6B is graph of an example defect density in an LED on the vertical axis as a function of the energy of photons emitted from the LED on the horizontal axis, as obtained through a measurement such as DLOS.

FIG. 6B is graph of an example defect density in an LED on the vertical axis as a function of the energy of photons exciting the LED on the horizontal axis, as obtained through a measurement such as DLOS. The defect energy, $E_d$, may be estimated from the onset of a rise in defect energy in the relationship shown in FIG. 6B. The defect energy, $E_d$, can be slightly below the half-bandgap point (due to the nature of the III-N bond). Therefore, in some implementations, the defect energy can be related to the peak energy $E_p$ (in meV) by the following formula:

$$E_d = E_p * 0.45 + 370 \text{ meV} \pm \Delta E, \quad (4)$$

where 370 meV is the approximate expected shift between mid-gap and some defect levels, and where ΔE is a tolerance on the energy, with values discussed above.

Figure 7:
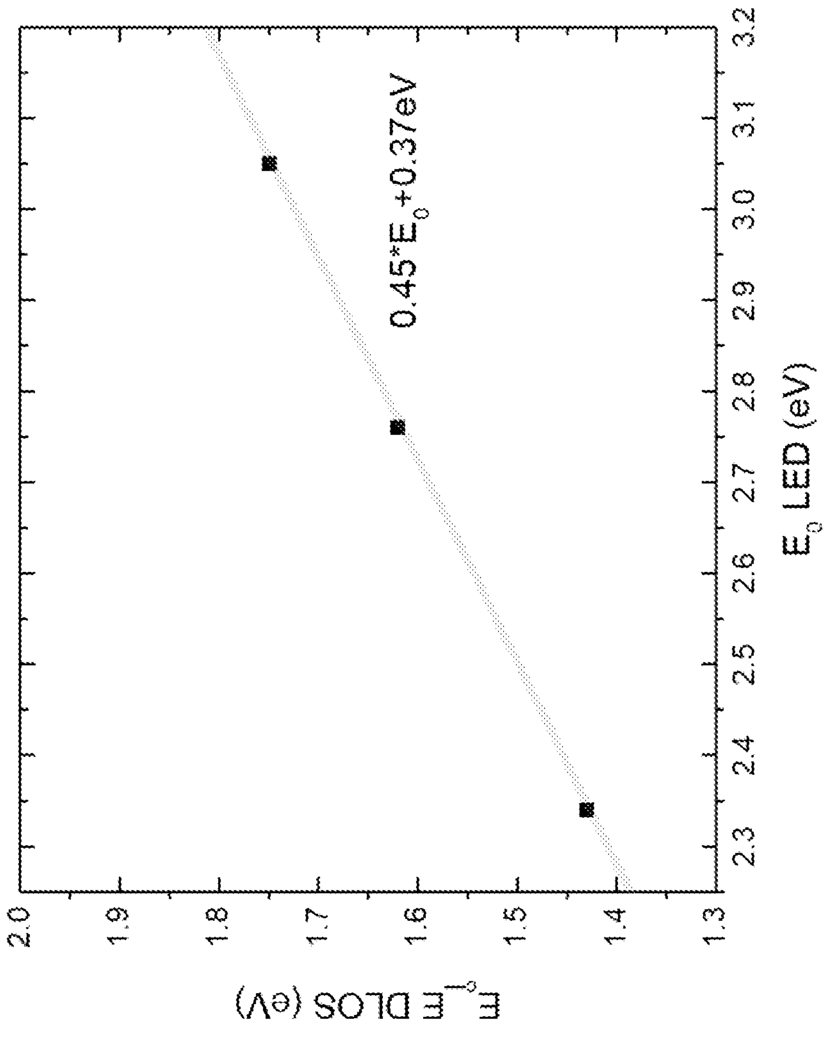
FIG. 7 is a graph of experimental data showing a relationship between $E_d$ and $E_p$.

FIG. 7 is a graph of experimental data showing a relationship between $E_d$ and $E_p$, where the slope and intercept of the line in FIG. 7 support the validity of equation (4). The data points plotted in FIG. 7 are obtained through DLOS measurements.

Besides DLOS, other techniques can be used to measure defects, including secondary ion mass spectroscopy (SIMS), deep level transient spectroscopy (DLTS), positron annihilation, imaging spectroscopy (e.g., cathodoluminescence, scanning near-field optical microscopy (SNOM)). Some of these techniques may be better suited for detecting specific types of defects.

Some implementations provide low defect densities in long-wavelength LEDs, e.g., with a peak emission wavelength of at least 560 nm (or 580 nm, 590 nm, 600 nm, 610 nm, 620 nm, 630 nm). Currently, conventional long-wavelength devices suffer from poor IQE (e.g., only about a few percent for red InGaN emitters), which is attributed to excessive defects in the LED structure. In contrast, implementations fabricated using the techniques described herein have low defect densities and a peak IQE of at least 10% (or 20%, 30%, 40%, 50%, 60%, 70%, 80%). Some implementations are characterized by their growth conditions. The growth conditions may be selected to facilitate a reduced defect density.

In some implementations, the growth temperature can affect the defect density in an MBE-grown LED. For clarity, as described herein, the growth temperature refers to the surface temperature of the wafer. This may differ from a hardware set-point temperature by a known offset.

Figure 8:
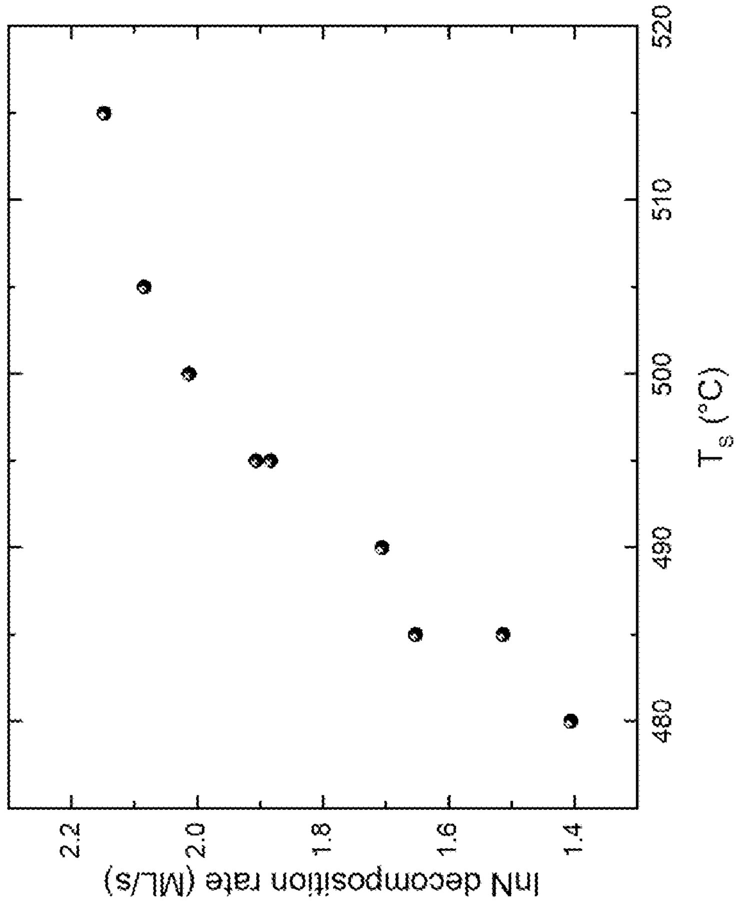
FIG. 8 is a graph of experimental data that show a relationship between growth temperature and InN decomposition rate, obtained from experiments.

FIG. 8 is a graph of experimental data that show a relationship between growth temperature and InN decomposition rate (measured in monolayers ("ML") per second), obtained from experiments, where an increase in the InN decomposition rate is related to an increase of defect density in an LED. The nitrogen pressure in the growth chamber is $5.5\times10^{-5}$ Torr. The nitrogen flux at the growing semiconductor surface is $2.3\times10^{15}$ atoms per $cm^2$ per second. Therefore, growth at a low temperature may limit or suppress InN decomposition, and thus reduce the formation of defects related to N vacancies when In-containing layers are grown.

Accordingly, in some implementations, LEDs are grown at a very low growth temperature. For example, a light-emitting layer can be grown at a temperature below 500° C. (or below 550° C., below 525° C., below 475° C., or below 450° C.). The growth temperature may be low enough that the In—N bond is stable on a time scale of several seconds. In some cases, this corresponds to a growth temperature below 500° C. or less.

In some implementations, the temperature and the N pressure are jointly configured such that the In—N bond is stable. In some implementations, the pressure of N adatoms is at least $1\times10^{-5}$ Torr (or $2\times10^{-5}$ Torr, $5\times10^{-5}$ Torr, $1\times10^{-4}$ Torr, $5\times10^{-4}$ Torr), and the temperature is less than 500° C. (or 550° C., 525° C., 475° C., 450° C.).

In some implementations, the layer stack structure may be annealed after growth. The annealing may lead to a re-organization of the crystal. The annealing may be performed in a vacuum or in an ambient gas (including an ambient gas including one or more of: $N_2$, $H_2$, $O_2$). The annealing temperature may be substantially higher than the growth temperature of the active layer. In some implementations, the annealing temperature can be at least 700° C. (or 800° C., 900° C., 1000° C., 1100° C.). In some implementations, the annealing temperature is higher than the growth temperature of an active layer by at least 100° C. (or 200° C., 300° C.).

In some implementations, the active layer is grown at a higher growth temperature, for example at least 550° C. (or 575° C., 600° C., 625° C., 650° C., 675° C., 700° C.). At such temperatures, the In—N bond may become unstable, which may lead to the formation of N-vacancies. To avoid this, implementations can make use of a relatively high nitrogen flux or pressure. For example, the nitrogen flux at the growing semiconductor surface can range between $1\times10^{15}$ atoms per $cm^2$ per second and $1\times10^{16}$ atoms per $cm^2$ per second. In some implementations, the flux is above $10^{15}$ (or $2\times10^{15}$, $5\times10^{15}$, $1\times10^{16}$, $2\times10^{16}$, $5\times10^{16}$) atoms per $cm^2$ per second.

A high flux of nitrogen adatoms may be achieved by various means. In a plasma-assisted MBE reactor, the flux may increase with the flow of $N_2$ precursor gas and/or with the power of the plasma. Accordingly, some implementations use a high $N_2$ flow and/or a high plasma power. However, because a very high plasma power might facilitate defects in the crystal, in some implementations, the plasma power is kept below a predetermined threshold value, and a high $N_2$ flow is selected to achieve a desired flux of nitrogen reactive species at the wafer surface. Some implementations use growth parameters resulting in a high N flow (to reduce the density of N-related vacancies) without using an excessive plasma power (which may facilitate other defects).

In a series of experiments, the inventors have investigated the impact of the nitrogen plasma conditions on the composition of the plasma, and on the resulting the IQE of an LED structure. Two plasma parameters were varied: the flow rate of the incoming $N_2$ gas, and the power of the plasma. The inventors then measured the composition of species in the plasma with optical spectroscopy—namely, by measuring the optical spectrum emitted by the plasma—as a function of the variable parameters. Two types of species can be generated by the plasma: atomic N (which causes sharp features in the optical spectrum) and molecular $N_2$ (which causes smooth features in the optical spectrum).

Figure 9:
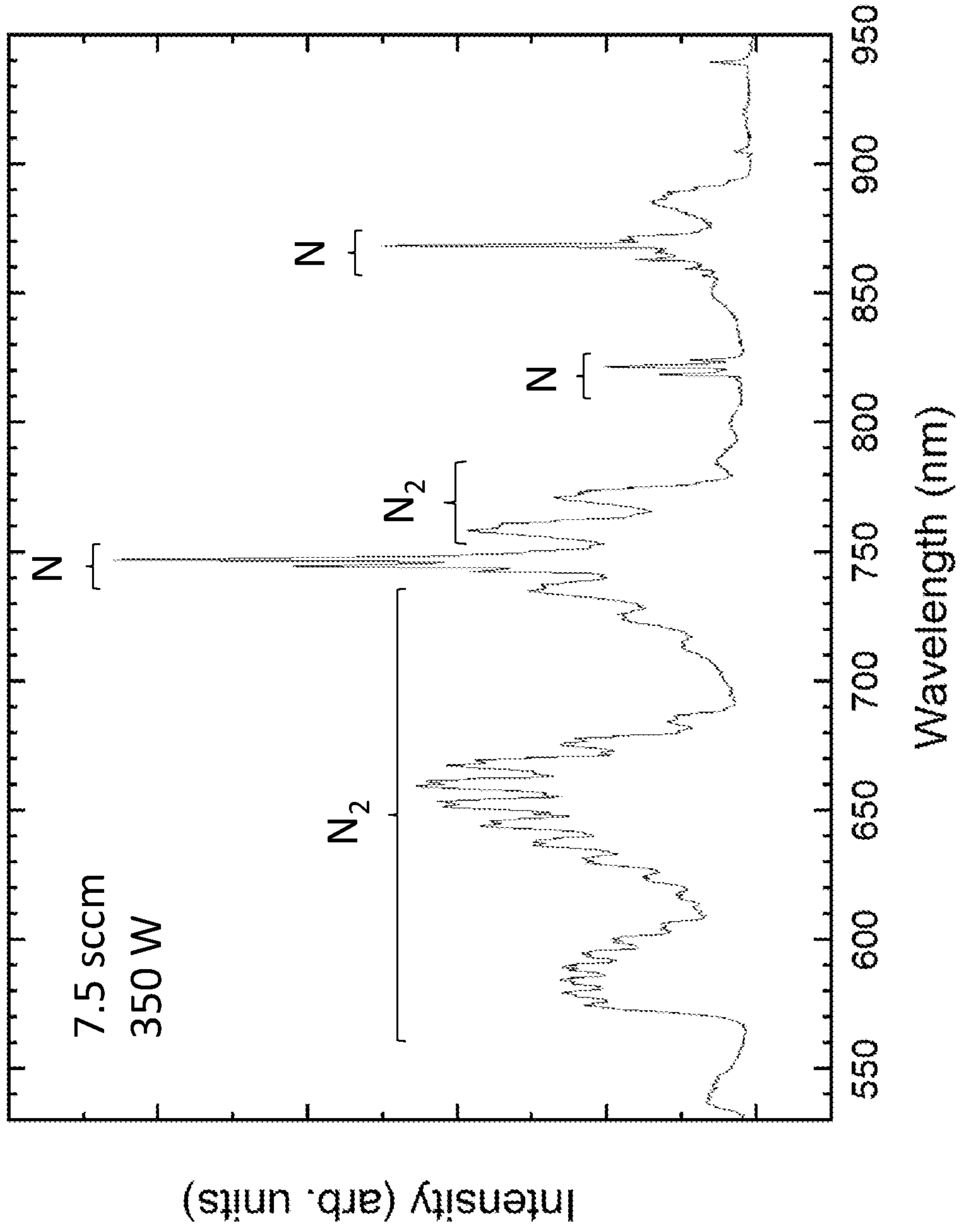
FIG. 9 is a graph of an emission spectrum from a plasma in an MBE growth chamber, in which the incoming $N_2$ flow was 7.5 standard cubic centimeters per minute ("sccm") and a plasma power of 350 W was used to create the plasma.

FIG. 9 is a graph of an emission spectrum from a plasma in an MBE growth chamber, in which the incoming $N_2$ flow was 7.5 standard cubic centimeters per minute ("sccm") and a plasma power of 350 W was used to create the plasma (it should be understood that such values can vary substantially depending the size and dimensions of the MBE growth chamber, the design of the electrical system that creates the plasma, etc.). In the graph of FIG. 9, several sets of relatively sharp and relatively smooth features can be seen, and the relative magnitude of these features is indicative of the relative presence of N and $N_2$ species in the plasma.

Figure 10B:
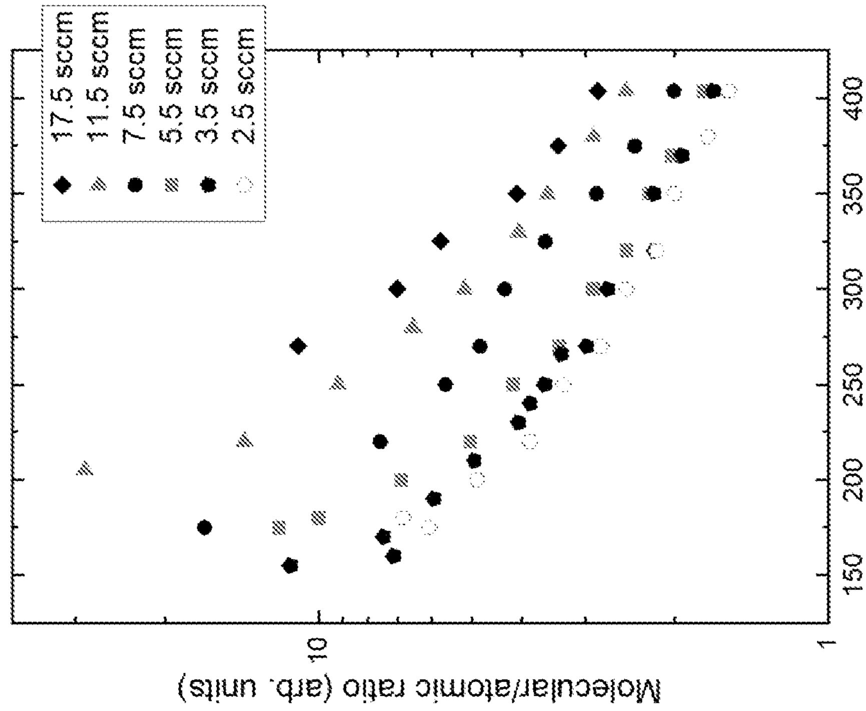
FIG. 10B is a graph showing the value of R for various different combinations of incoming $N_2$ flow rate and plasma power.
Figure 10A:
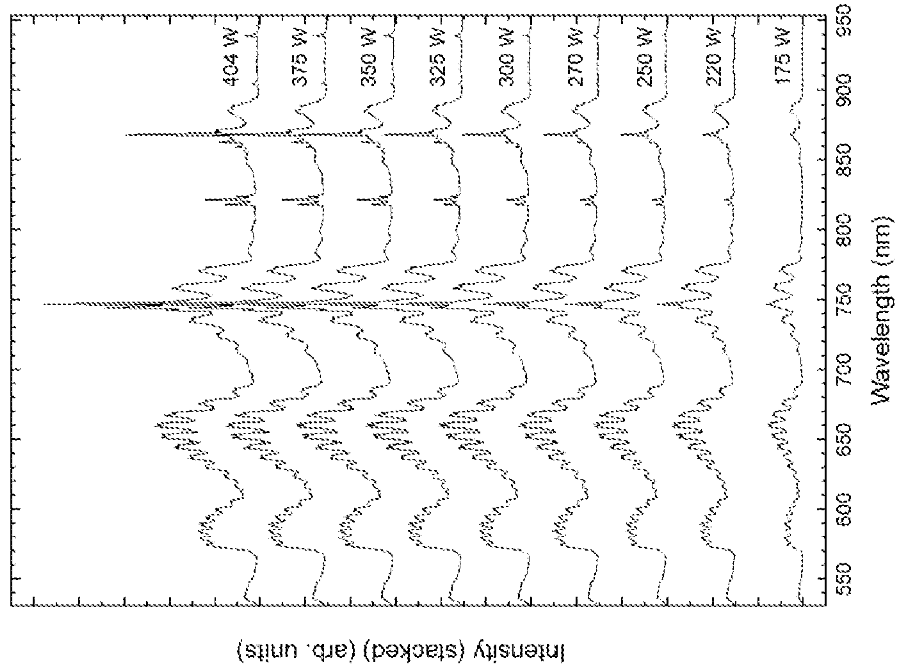
FIG. 10A is a graph of emission spectra from plasmas in a growth chamber for different plasma powers that range from 175 W to 404 W (for a constant incoming $N_2$ flow of 7.5 sccm).

FIG. 10A is a graph of emission spectra from plasmas in a growth chamber for different plasma powers that range from 175 W to 404 W (for a constant incoming $N_2$ flow of 7.5 sccm). A comparison of the different spectra illustrates that the relative amount of atomic N increases for a higher plasma power. The inventors derived a metric R to quantify the relative ratio of molecular to atomic N species in the plasma, namely R=I(661)/(I(821)−I(814)), where I(xxx) denotes the optical intensity at a wavelength of xxx nm. In the spectra depicted in FIG. 10A, the emission peak at 661 nm is characteristic of molecular $N_2$, the emission peak at 821 nm is characteristic of atomic N, and 814 nm is a wavelength with low emission, so that 1(814) is used for background subtraction.

FIG. 10B is a graph showing the value of R for various different combinations of incoming N2 flow rate and plasma power, which illustrates that R increases with increasing N2 flow rate and with decreasing plasma power. The spectra of FIG. 10A represent spectra captured with an uncalibrated spectrometer and therefore are expressed in arbitrary units. Nonetheless, the wavelength sensitivity of the spectrometer's silicon detector is smooth in the wavelength range of interest, so that R can be used as a semi-quantitative indication of the composition of the plasma (for example, R~10 indicates a relatively high amount of molecular $N_2$ in the plasma, whereas R~1 indicates a relatively low amount of molecular $N_2$).

FIG. 10B shows the value of R for various combinations of incoming $N_2$ flow and plasma power. For a given $N_2$ flow value, there is a minimum power, $P_m$, required to ignite the plasma, and R tends to be highest near the plasma ignition threshold. For example, for a given $N_2$ flow, R tends to be high between $P_m$ and $\alpha P_m$, where a is a multiplicative factor equal to, for example, 1.1, 1.3, or 1.5, and/or R tends to be high between $P_m$ and $P_m+\Delta$, where $\Delta$ is equal to, for example, 20 W, 50 W, or 100 W.

Thus, the inventors have shown that the species composition of the plasma can be controlled, and quantified by R, through control of the incoming $N_2$ flow and of the plasma power. The inventors also investigated how this species composition of the plasma, as quantified by R, influenced the IQE of LEDs, by growing series of LEDs under varied conditions.

Figure 11:
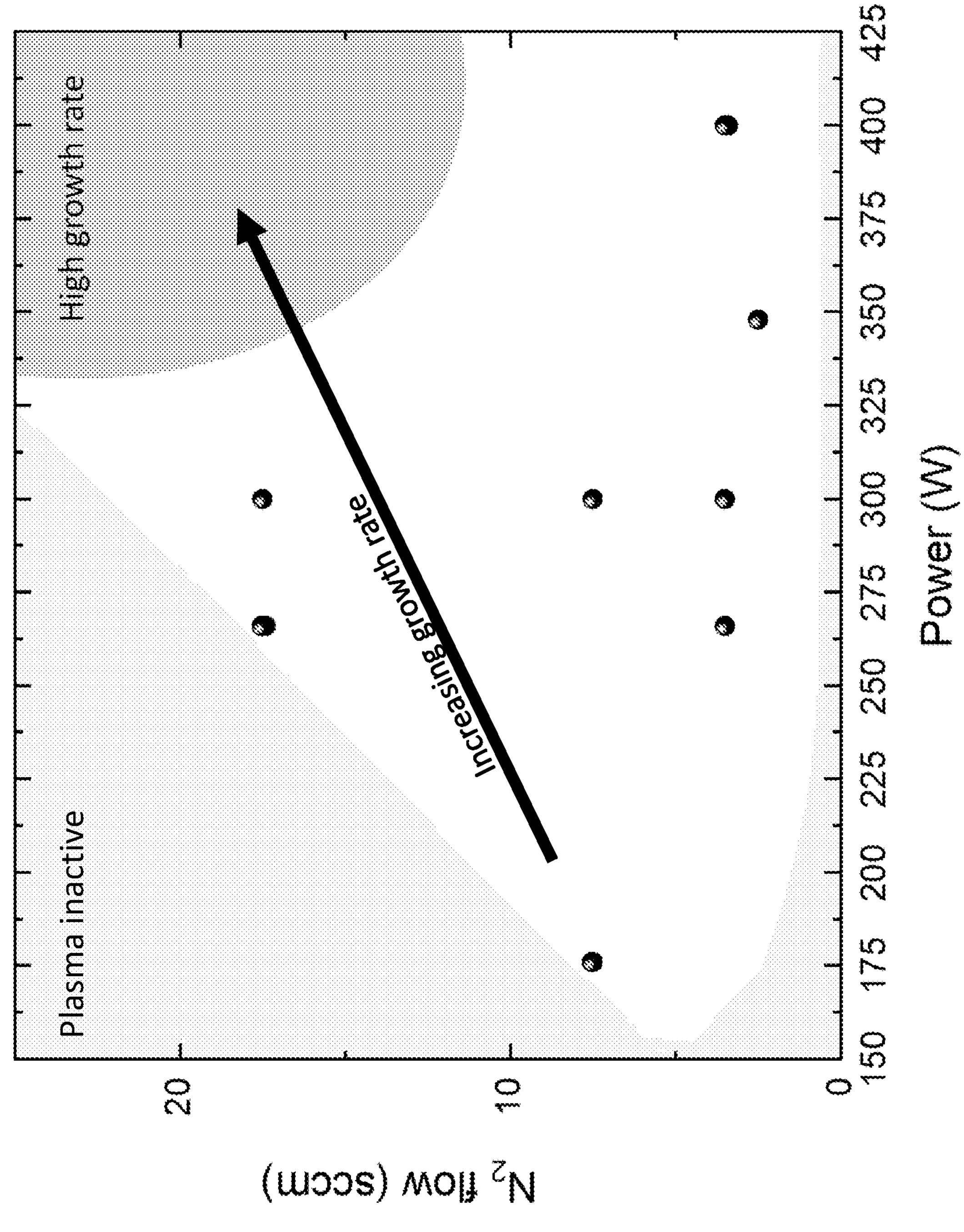
FIG. 11 is a plot of points representing LED samples grown with different combinations of incoming $N_2$ flow rate and plasma power.

FIG. 11 is a plot of points representing LED samples grown with different combinations of incoming $N_2$ flow rate and plasma power. Numbers above the points on the plot indicate a sample identifier, and rectangles around a sample identifier indicate that the sample included a single quantum well, while sample identifiers without a surrounding rectangle correspond to samples with multiple quantum wells. As seen from FIG. 11, if the plasma power is too low, the plasma is not ignited, and high growth rates correspond to high plasma power and to high $N_2$ flow.

Figure 12:
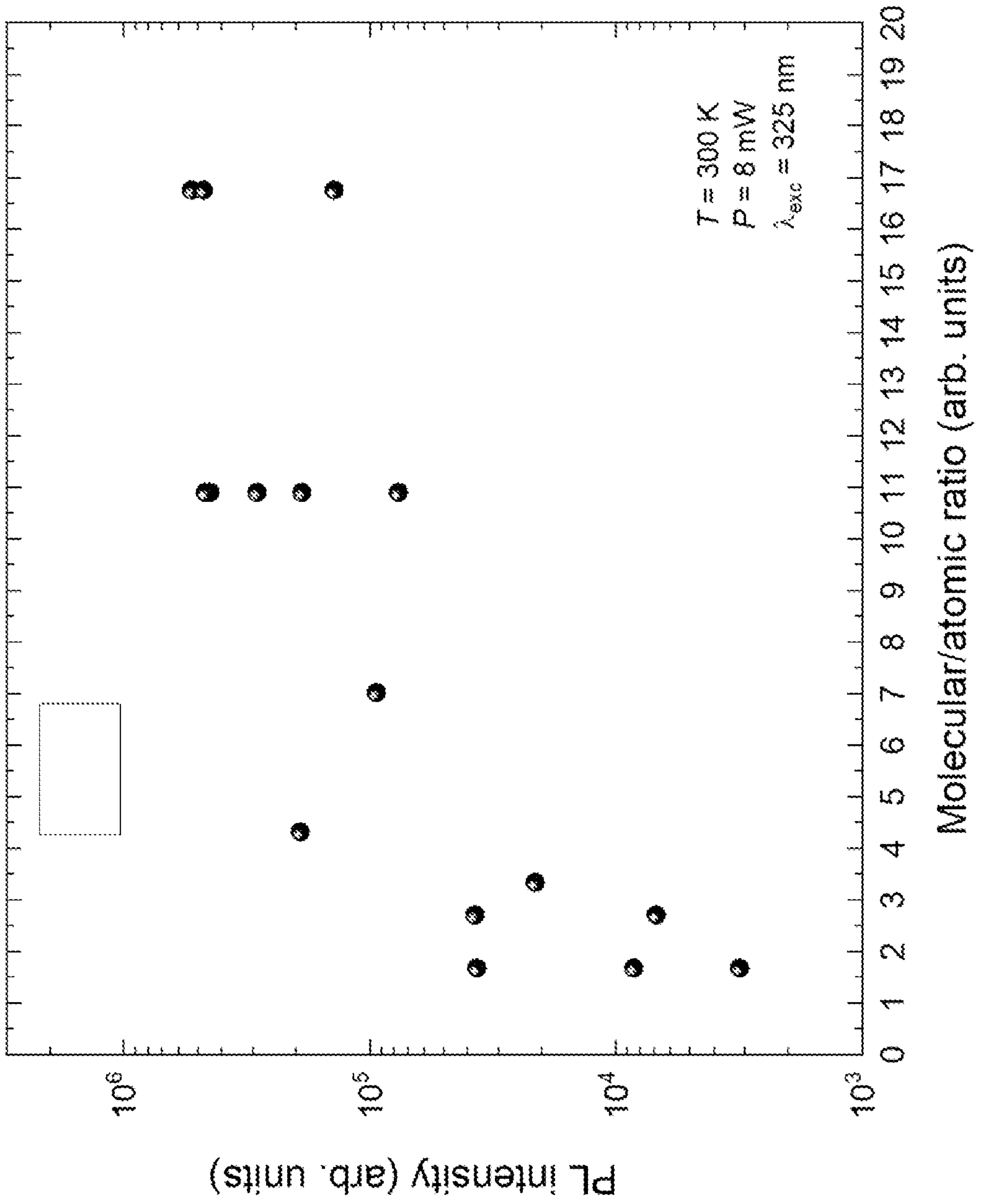
FIG. 12 is a plot of points representing LEDs grown with different molecular $N_2$ to atomic N ratios and showing the photoluminescence (PL) intensity emitted from the LEDs when operated at a temperature of 300 K and pumped by 8 mW of 325 nm laser excitation.

FIG. 12 is a plot of points representing LEDs grown with different molecular $N_2$ to atomic N ratios, and showing the photoluminescence (PL) intensity emitted from the LEDs when operated at a temperature of 300 K and pumped by 8 mW of 325 nm laser excitation. The PL intensity is plotted as a function of R in FIG. 12. As seen from FIG. 12, samples with low values of R suffer from low intensity, whereas samples with intermediate or high values of R are brighter and have higher intensities.

Therefore, the inventors have shown that plasma conditions that correspond to a relatively high value of R are beneficial for material quality, which may be due to the reduction of a density of a defect that is deleterious to IQE. The beneficial plasma conditions can be achieved by utilizing a moderate plasma power for a given $N_2$ flow (i.e., a plasma power that is not very high compared to the minimum power required for plasma ignition). Such conditions may be achieved for a relatively low or a relatively high growth rate, as shown in FIG. 11, by selecting an appropriate $N_2$ flow and plasma power. For example, a desired $N_2$ flow may be selected to facilitate a desired epitaxial growth rate, and then an appropriate value of the plasma power that is not too high compared to the ignition power may be selected for that $N_2$ flow rate.

By using such plasma conditions to grow, with MBE, a light emitting region of an LED (e.g., a plasma power or less than 30% above the $P_m$ value for the $N_2$ flow rate used to grow the light emitting region), the inventors grew a sample having InGaN QW layers and InGaN barriers. For this sample, the inventors measured an IQE of about 10% for an emission wavelength of about 430 nm. This sample had no GaN layers in direct contact with the QW layers of the LED, but rather, the barrier layers on opposite sides of the QW layers included indium. The QWs and barriers were grown with no growth interruption at interfaces between the adjacent different layers. Two Ga cells were installed in the MBE reactor (i.e., the growth chamber), and the two cells had different flow rates of Ga into the reactor. One Ga cell was used for growing the QWs, and another Ga cell was used for growing the barriers. This configuration enabled a modulation of the In content in QW and barrier layers without ramping the temperature of the substrate on which the layers were grown, so as to obviate the need for any growth interruption. For clarity, a growth interruption may be described as a period of time where no substantial growth of the epitaxial layer stack occurs, between periods of time where substantial growth occurs. A growth interruption also may be described as a step in which conditions are selected to dry the surface from a selected metallic species (e.g., Ga).

Figure 13:
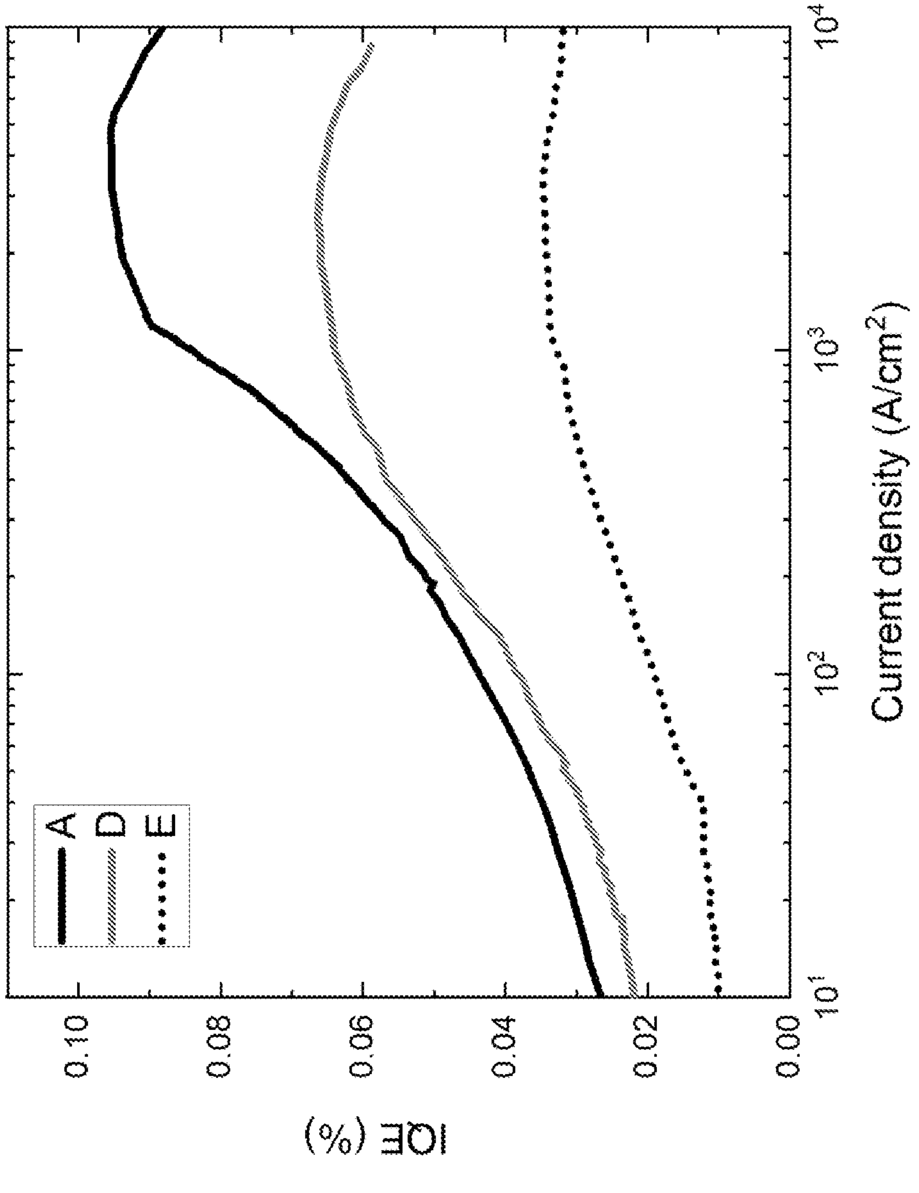
FIG. 13 is a graph that shows the IQE measured for five different LED samples, as a function of the photocurrent density, J, generated by the laser in the active region.

FIG. 13 is a graph that shows the IQE measured for three different LED samples, as a function of the photocurrent density, J, generated by 405 nm laser radiation provided to the active region of the LED. The photocurrent density, J, expressed in terms of an equivalent electrical current density in units of $A/cm^2$, on the horizontal axis, is determined by measuring the laser power density impinging on the LED sample and multiplying by the absorption coefficient of the light-emitting region of the LED, and the IQE is One sample that was grown with suitable plasma conditions and InGaN barriers without temporal interruptions of in the growth had a peak IQE of about 10%.

Optoelectronic devices can be grown with appropriate plasma conditions to achieve a high material quality—for example, conditions in which the plasma power is not very high compared to the minimum ignition power for the selected $N_2$ flow. For example, the plasma power can be less than 1.1 times, or less than 1.3 times, or less than 1.5 times the minimum ignition power. Implementations further include methods to operate an MBE reactor in such conditions, methods to select such plasma conditions, methods to measure an optical spectrum of a plasma to achieve such conditions (including conditions with a relatively high molecular to atomic ratio).

To further study the impact of barriers on the efficiency of the LED, a series of LED structures with a 2.7 nm thick InGaN quantum well sandwiched between 50 nm thick InGaN barriers were grown by MBE, with different structures having barriers with different In % (i.e., 0.2%, 5% and 6%). In each case, the transition between the QWs and the barriers did not require a growth interrupt, because both layers were grown under In-rich conditions.

Figure 14:
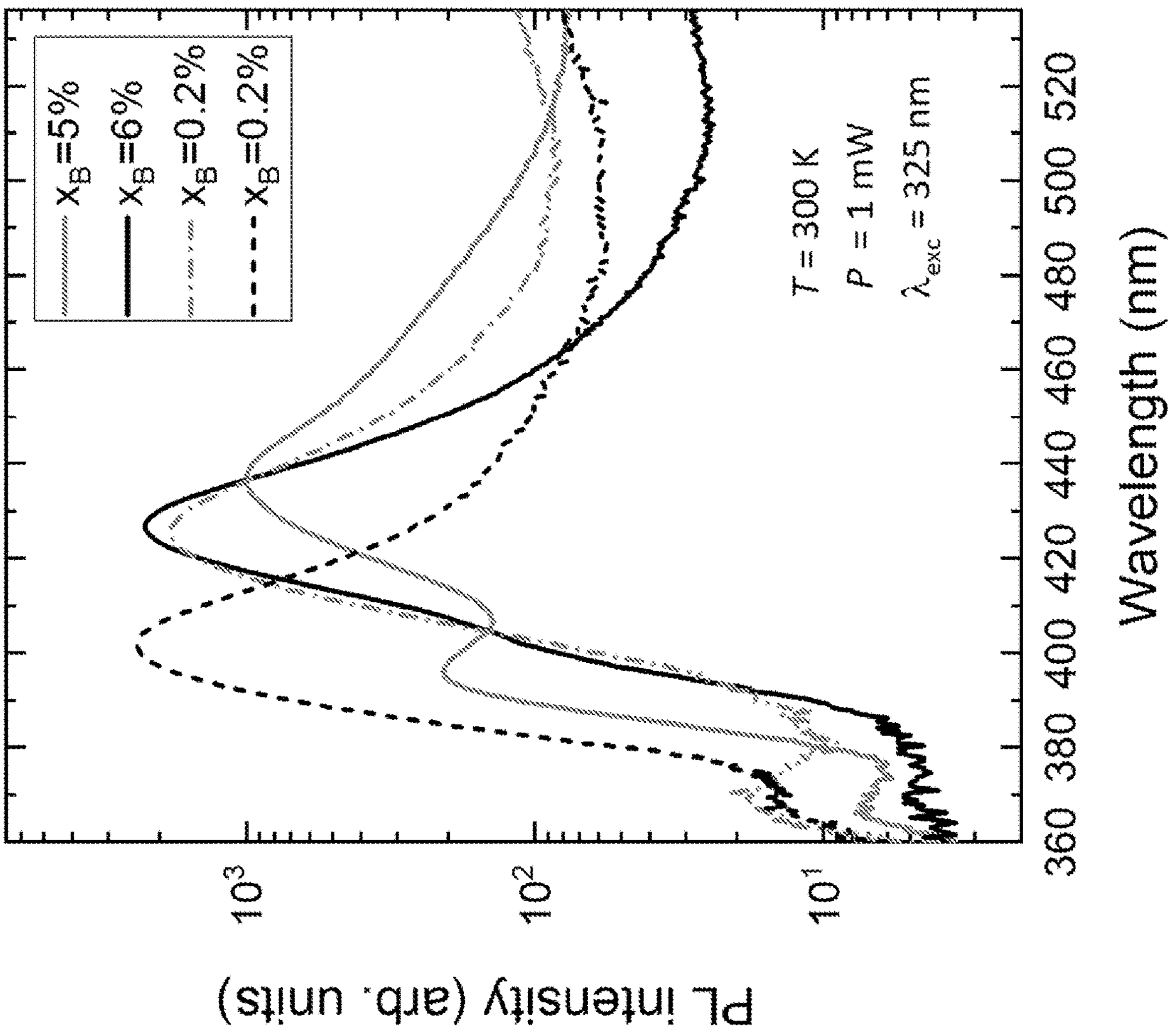
FIG. 14 is a graph of the PL spectra for these samples having barriers with an indium content of 0.2%, 5%, and 6%, with the PL spectral for each sample being measured at a similar excitation powers.

FIG. 14 is a graph of the PL spectra for these samples having barriers with an indium content of 0.2%, 5%, and 6%, with the PL spectral for each sample being measured at a similar excitation powers. The PL intensity of all of these samples is substantially similar, regardless of the In concentration in the barrier layers. Therefore, improved efficiency of an LED may be achieved by growing barriers and barrier/QW transitions of the LED with appropriate MBE conditions, regardless of the resulting composition of the barriers.

Such LED structures that include InGaN barrier layers (e.g., having In % that is great than or equal to 0.2%) differ from conventional LED structures, in that conventional structures have GaN barriers (which are typically grown under Ga-rich conditions) and InGaN QWs (which are typically grown under In-rich conditions). After the GaN barriers are grown in conventional structures, Ga atoms may remain at the wafer surface, and these may need to be flushed away from the surface to enable InGaN growth, and this process may require a growth interrupt. Growth interruptions may occur, for example, by: (1) thermal desorption; or (2) consumption of the Ga by exposure to N plasma. Thermal desorption may be suitable when the substrate temperature is above a threshold temperature (e.g., about 700° C. if the metallic species is Ga, or 790° C. if the metallic species is Al). During a thermal desorption, cells that provide metal atoms to the growth chamber can be closed to prevent additional metal atoms from reaching chamber, and N-plasma source can be turned off. The duration of the thermal desorption interruption can depend on the substrate temperature and the amount of accumulated Ga on the surface. For example, for growths at 720° C. a thermal desorption interrupt may take several (e.g., 1-3) minutes when only thermal desorption is employed to sufficiently flush away surface Ga atoms for the next step of the growth process to proceed. In some implementations, the duration of an effective growth interrupt can be shortened by flushing away surface Ga atoms through both thermal desorption and exposure of the surface Ga atoms to the N plasma. In cases where the substrate temperature is lower (e.g., 650° C., which may be suitable to grow InGaN), thermal desorption may not occur effectively to flush Ga atoms. At such lower growth temperatures, surface Ga atoms may be exposed to the N plasma to flush the surface Ga atoms and growing GaN in the process. This implies leaving open the N-flux from a cell into the growth chamber during the duration of the interruption and shuttering (closing) all metallic fluxes from cells into the growth chamber. In this case, the duration of the interruption may depend on the N-plasma growth rate and the amount of excess Ga at the surface. The amount of Ga at the surface may be minimized by setting the Ga flux only slight above the Ga/N stoichiometry. In some implementations, reflection high-energy electron diffraction (RHEED) measurements may be used to determine the needed length of an interruption, because a metallic surface will have a dim diffraction pattern, whereas upon drying of the surface, a high intensity is recovered.

In contrast to these conventional structures, growth interruptions between QW's and barriers may be avoided by setting the Ga flux below the Ga/N stoichiometry. On its own, setting the Ga flux below the Ga/N stoichiometry may lead to decreased material quality and therefore a surfactant, e.g., indium, may be employed to maintain a metal rich surface without requiring an interruption. Therefore, for such structures with InGaN barriers, both the barrier and the QW are grown in In-rich conditions, so that it is not necessary to flush Ga atoms before growing the QWs. Such growth conditions may result in a wide range of InGaN compositions in the barriers (for example, between 0.2% and 6%, as in the aforementioned experiments, although higher or lower In concentrations may be acceptable in some implementations). Some implementations include barriers grown in In-rich conditions, but with a resulting In concentration in the grown LED that is very low (possibly too low to be detected). Nevertheless, such growth conditions may avoid growth interruptions.

As described above, a growth interruption may include a period of time where no substantial growth occurs, between periods of time where substantial growth occurs or may include a step in which conditions are selected to dry the surface from a selected metallic species (e.g., Ga). A growth interrupt may last at least 60s (or 30s, 10s, 1s). Depending on the growth conditions, a short growth interruption may be acceptable or deleterious. In some implementations, interruptions of even a few seconds or more may be problematic if they lead to substantial defect creation.

Light-emitting region having QWs and barriers (or more generally, an active region having multiple layers including at least one In-comprising QW) can be grown with MBE in which the transitions between growing some adjacent layers of the light-emitting region are performed without a growth interruption, or with a pause between layers which is less than 0.1s (or 1s, 5s, 10s, 30s). In some implementations, the growth conditions are selected such that the Ga flux into the growth chamber and onto the wafer is below the Ga/N stoichiometry at the transition between layers. In some implementations, metallic species (including In) are injected into the growth chamber at all times during the transition.

Some implementations may use a growth interruption but employ conditions that prevent the formation of defects during the interruption. For example, a species may still be injected into the growth chamber and onto the wafer surface during the interruption, while no substantial growth on the wafer is occurring. In may be injected, while Ga and N are not injected, or a different metallic species may be deposited. A different gas (such as H, or $N_2$ which does not come from the plasma) may be injected.

Some implementations make use of several cells to facilitate the avoidance of growth interruptions. A plurality of Ga cells that provide different fluxes of Ga atoms may be used to modulate the Ga flow rapidly without pauses, for example, by opening and closing shutters between the cells and the growth chamber, as demonstrated herein. For example, a lower Ga flow may be used for higher In concentration in the MBE-grown LED, while a constant In flow is used.

Figure 15:
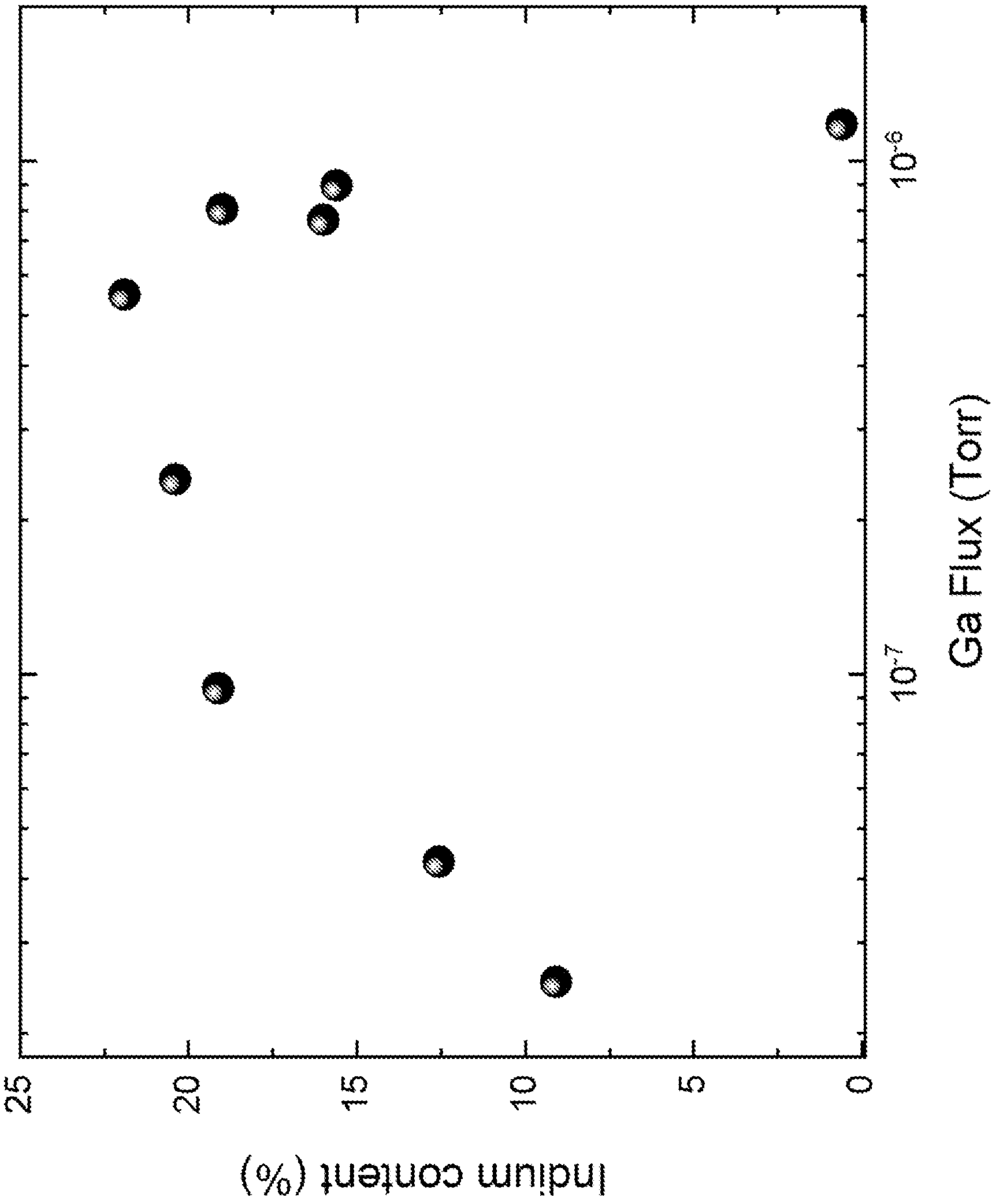
FIG. 15 is a graph of In % in a QW layer of an MBE-grown LED as a function of Ga flux in the growth chamber onto the wafer when the In flux and the plasma conditions are constant, where measured partial pressure of Ga in the growth chamber on the horizontal axis of the graph serves as a proxy of the Ga flux onto the wafer surface.

FIG. 15 is a graph of In % in a QW layer of an MBE-grown LED as a function of Ga flux in the growth chamber onto the wafer when the In flux and the plasma conditions are constant, where measured partial pressure of Ga in the growth chamber on the horizontal axis of the graph serves as a proxy of the Ga flux onto the wafer surface.

As seen from FIG. 15, for a constant In flux and plasma conditions, the In composition of a QW can be controlled by controlling the Ga flux (F_Ga). Each point on the graph of FIG. 15 corresponds to an MBE-grown LED. In a first region, or range of F_Ga values that are below a first threshold value, the In % decreases with decreasing F_Ga. In a second region, or range of F_Ga values between the first threshold value and a second threshold value, there is a plateau of relatively constant In composition for intermediate values of F_Ga. In a third region, for high F_Ga values above the second threshold value, In % decreases with increasing F_Ga. QWs may be grown in the second region (where the In % is most stable) or in the third region (where a fine control of the In % may be enabled by controlling F_Ga). Barriers may be grown in the third region, where a fine control of In % may be enabled by controlling F_Ga. In the third region, a very low In % may be achieved with higher F_Ga values above the second threshold value. All these growths remain in an In-rich regime (i.e., when the growth chamber includes an atmosphere rich with In), so that no flushing of Ga atoms is required between layers. Some implementations use of two In cells to control the In concentration in various different layers (e.g., QWs and barriers).

In some implementations, an MBE-grown light-emitting region may include only a single QW (or other light-emitting layer such as a double heterostructure), in which case the techniques described herein can be applied to the transitions between the single QW and its adjacent barrier layers.

Some implementations combine the aforementioned techniques of growing adjacent layers of different material compositions (e.g., QWs and barriers without interruptions) with the aforementioned techniques of controlling the plasma conditions to control the proportion of molecular nitrogen in the plasma. For example, in some implementations, the incoming $N_2$ flow and plasma power are selected to provide a high ratio of molecular to atomic N-species in the plasma, and the active region is grown without interruptions between growth of different layers in the active region.

In some implementations, the MBE-grown active region includes various layers (e.g., barriers) that are grown with M-rich conditions, where M is a metal element other than Ga. M may be In (as in the samples described above), but other metals also may be used, including Al, Sn, Sb and other suitable metals. M may be a metal that does not incorporate significantly in the crystal structure of the layer stack, in which case M may serve the purpose of maintaining metal-rich conditions at the surface while avoiding an accumulation of Ga at the surface. M may be a metal which evaporates at relatively low temperature, such as Sn. If M is different from In, In may or may not also be present during the growth of the barrier layer. In some implementations, a QW can be grown with In-rich conditions, and at least one barrier adjacent to (above and/or below) the QW can be grown with M-rich conditions.

For clarity, as used herein, the terms In-rich/M-rich/Ga-rich correspond to a relative stoichiometry of the metallic species. Separately, the light-emitting region of the LED may be grown under N-rich conditions. In some cases, the flux of N-species is the highest, followed by the flux of M and/or In, and the flux of Ga is the lowest.

In some implementations, the ratio of nitrogen to group III elements (the V/III) ratio is high, corresponding to N-rich conditions. The ratio may be higher than 10 (or 2, 5, 20, 50, 100). When In-containing layers are grown, the ratio of indium flux to Ga flux may be high: it may be above 2 (or 5, 10, 20, 50, 100).

At a growth temperature on the wafer below 600° C., the flux conditions may be as follows: N_flux>In_flux>Ga_flux. In some implementations, an In-containing layer is grown with conditions satisfying: N_flux>In_flux*m and In_flux>Ga_flux*m, with m being a number larger than 2 (or 5, 10).

At a growth temperature on the wafer above 600° C., the flux conditions may be as follows: In_flux>N_flux>Ga_flux. In some implementations, an In-containing layer is grown with conditions satisfying: In_flux>N_flux*m and N_flux>Ga_flux*m, with m being a number larger than 2 (or 5, 10).

Some layers may be grown with a metal M that is distinct from Ga and In (e.g., Sn, Al, Sb, or other suitable metals). The conditions may satisfy N_flux>M_flux*m and M_flux>Ga_flux*m, or the conditions may satisfy M_flux>N_flux*m and N_flux>Ga_flux*m, where m is a number larger than 2 (or 5, 10).

In some implementations, the light-emitting region includes quantum wells and barriers, and the barriers can be grown at the same growth temperature as the quantum wells. In some implementations, the barriers can include two-step barriers, in which a first part of the barriers is grown at a first temperature that is substantially as the temperature at which the QWs are grown, and a second part of the barriers is grown at a second temperature that is higher by at least 50° C. (or 25° C., 75° C., 100° C.) than the first temperature. The barriers may include In, with a composition of at least 1% (or 2%, 3%, 5%), or with a composition in a range 0.1% to 1% (or 0.1% to 5%, or 0.1% to 10% or 0.5% to 10%). The barriers may include InGaN, with an In composition of at least 1% (or 2%, 3%, 5%), or with an In composition in a range 0.1% to 1% (or 0.1% to 5%, or 0.1% to 10% or 0.5% to 10%). Additional steps may be envisioned (e.g., the temperature may be varied more than twice during the growth of a layer). Other variations, including temperature ramps, are also possible.

In some cases, the growth of a GaN layer that does not include In below or inside the active region may be detrimental to the efficiency of the MBE-grown LED, due to defects including vacancies that may ride the GaN surface and be prone to incorporation in the overlying In-containing layers.

Accordingly, in some implementations, the active region of the MBE-grown LED includes a plurality of In-containing layers but does not contain any GaN layer. This stands in contrast to conventional LEDs, where GaN layers are often present as barriers between QW layers or between an InGaN underlayer and the active region. Referring again to FIG. 1, some implementations of the MBE-grown LEDs include: an In-containing underlayer 114 (for example with In %>2% and a thickness of at least 20 nm), and an alternating series of InGaN barriers (for example with In %>1%) and QW layers (for example with In %>20%). In some implementations, no layer with In %<1% (or 2%) is present between the QW layers. Some implementations include one or more In-containing QW layers with In %>1% (or 2%, 5%) everywhere across the QW layers. In a multi-QW structure, a thickness of the light emitting layer maybe be at least 20 nm.

Some implementations emit light at a long wavelength of light. Accordingly, a light-emitting QW layer may be characterized by an In concentration of at least 35% (or 25%, 30%, 40%, 45%, 50%). Once the active region is grown, layers containing no In may be present above the active region (for example, in the EBL and in the p-doped GaN waveguide layer). In-containing layers may include InGaN, AlInN, and AlInGaN.

In some implementations, a pulsed/modulated growth scheme within the growth chamber can be used, in which the flux of different materials from the cells into the growth chamber and onto the wafer surface is modulated. In some cases, In and Ga are injected from cells into the growth chamber at different times. In some cases, the N flux is varied through time. In some implementations, an alternating series of steps can be performed, in which a first step has a low N flux and a high Ga flux, and a second step has a high N flux and a high In flux. These first and second steps may be alternated repeatedly (for example, with a period of about a few seconds or tens of seconds). Fractional layers may be formed on the semiconductor layer stack grown on the wafer in each step, leading to the formation of an InGaN layer after enough steps occur. In some implementations, a very low flux of N onto the wafer in the growth chamber can achieved by closing a shutter between the N cell and the growth chamber.

The difference in N flux described above may also be applied to processes for growing light-emitting regions that include GaN layers. In some implementations, GaN layers are grown at a relatively low N flux, while In-containing layers are grown at a relatively high N flux. The relatively high N flux may be at least 2× (or 3×, 5×, 10×, 15×, 20×, 50×) the relatively low N flux. Other growth parameters (such as temperature) may be maintained while the N flux is varied. The N flux may be varied abruptly by activating different N sources (e.g., different N cells) that provide different N flux. In some implementations, a first cell can provide low N flux, and a second cell can provide high N flux. The second cell can be closed (e.g., by a shutter) during the growth of some layers (e.g., GaN layers) and can be open (e.g., by opening the shutter) during the growth of other layers (e.g., In-containing layers). This approach can be generalized to more than two cells, to provide more than two different N fluxes. In some implementations, this approaching of using multiple different cells to provide different N fluxes enables a significant increase in N flux on the wafer (e.g., 2× or more, as described above) in a short time (e.g., less than 0.1 s or 1 s or 10 s).

In some implementations, a first part of the epitaxial stack can be grown with first plasma conditions, and a second part of the epitaxial stack, which includes the active region, can be grown with second plasma conditions. The second plasma conditions may be selected to improve the efficiency of the active region. As disclosed herein, this may correspond to a relatively high ratio of molecular to atomic N-species in the plasma, or to a relatively low plasma power and high N flow (i.e., close to the upper boundary of the plasma ignition diagram shown in FIG. 11). The first plasma condition may be used to optimize the growth for other parts of the epitaxial stack (for example, if the plasma conditions used for the active region growth are not optimal for other parts of the epitaxial stack). Properties which can be optimized by the first growth conditions may include: growth rate; morphology (such as smooth morphology, or step-flow morphology); preferential growth in specific directions (such as preferential growth in the vertical direction, or along a c-plane, along an m-plane, along an a-plane, along a semipolar plane); efficient incorporation of dopants (including Si and/or Mg).

Figure 16:
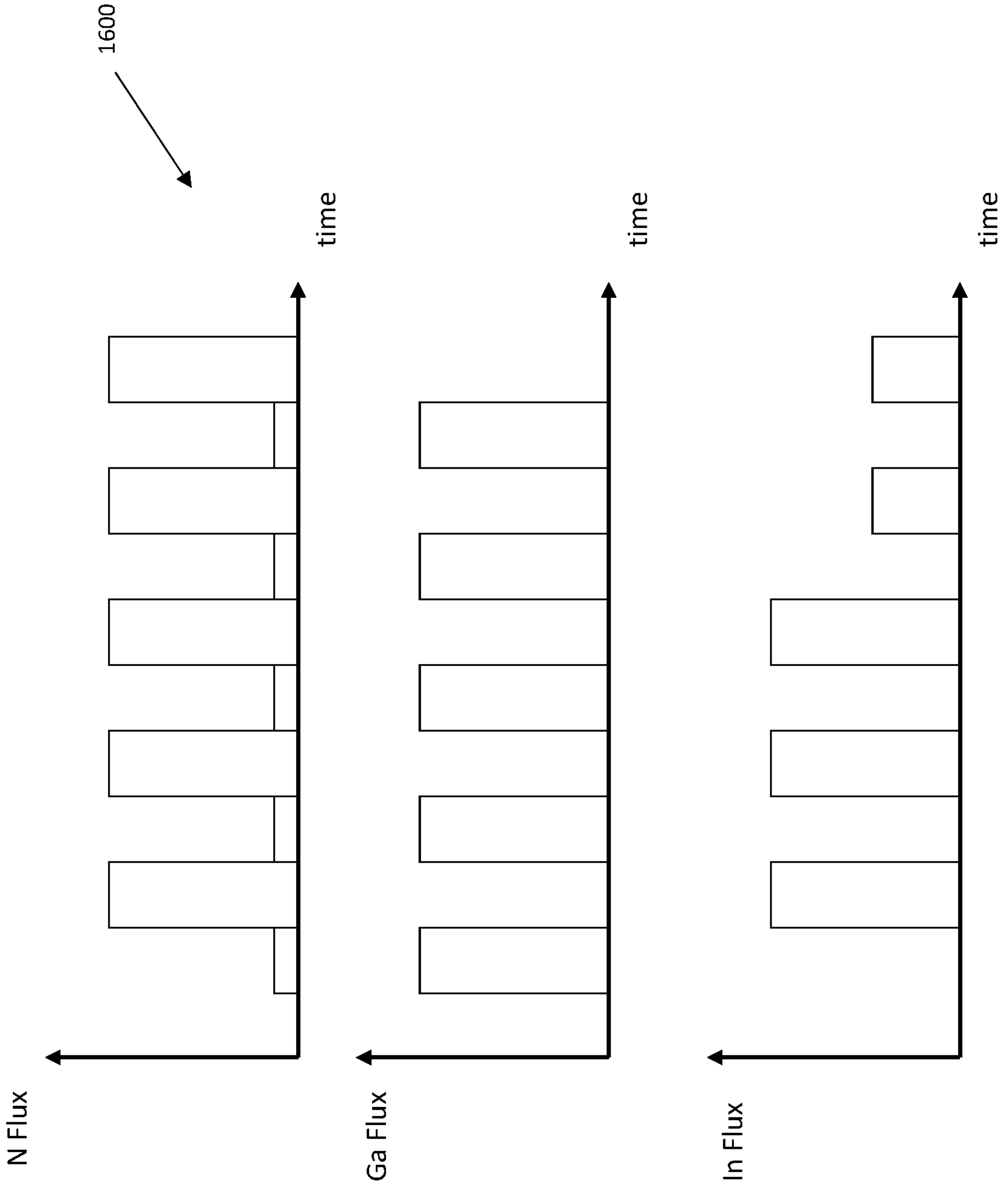
FIG. 16 is a timing diagram of example fluxes of three different species (N, Ga, In) into the growth chamber and onto the wafer as a function of time to enable pulsed growth of a semiconductor epitaxial stack on the wafer.

FIG. 16 is a timing diagram 1600 of example fluxes of three different species (N, Ga, In) into the growth chamber and onto the wafer as a function of time to enable pulsed growth of a semiconductor epitaxial stack on the wafer. The timing diagram includes three graphs of each of the three example fluxes over time, with the amount of flux for a species shown on the vertical axis of the graph for the species, and the time of the flux shown on the horizontal axis. The units on the vertical axis of each graph are arbitrary, and the units on the horizontal axis are arbitrary but the same for each graph.

As shown in the timing diagram 1600, the N flux varies between a high value and a low value. Ga is flowed when the N flux is low, and In is flown when the N flux is high. The duration of each flow step may be short enough to correspond to about one or a few atomic monolayers deposited on the epitaxial stack, or to a fraction of a monolayer (e.g., less than 1 ML, less than 0.75 ML, less than 0.5 ML, less than 0.25 ML). In some implementations, the amount of In flux may vary across the In-injection steps, rather than occurring at a constant amount, enabling the growth of layers with compositions that vary across the growth step. In the example timing diagram 1600 shown in FIG. 16, the first three In flow steps have relatively higher In flux (for example, to grow a QW layer) and the last two steps have a relatively lower In flux (for example, to grown a barrier layer). The number of steps to form a layer may be at least 10 (or 2, 5, 20, 50, 100, 500, 1000).

The incorporation of impurities in epitaxial layers grown by MBE can affect the luminance and efficiency of an MBE-grown LED. To understand these effects, the impurities in conventional LEDs structures with GaN barriers and InGaN QWs grown with standard plasma conditions and in LED structures having InGaN barriers and QWs grown with molecular N-rich plasma conditions and with no interrupts between the growth of adjacent barriers and QWs was observed and the optical performance of the different structures was compared.

Figure 17A:
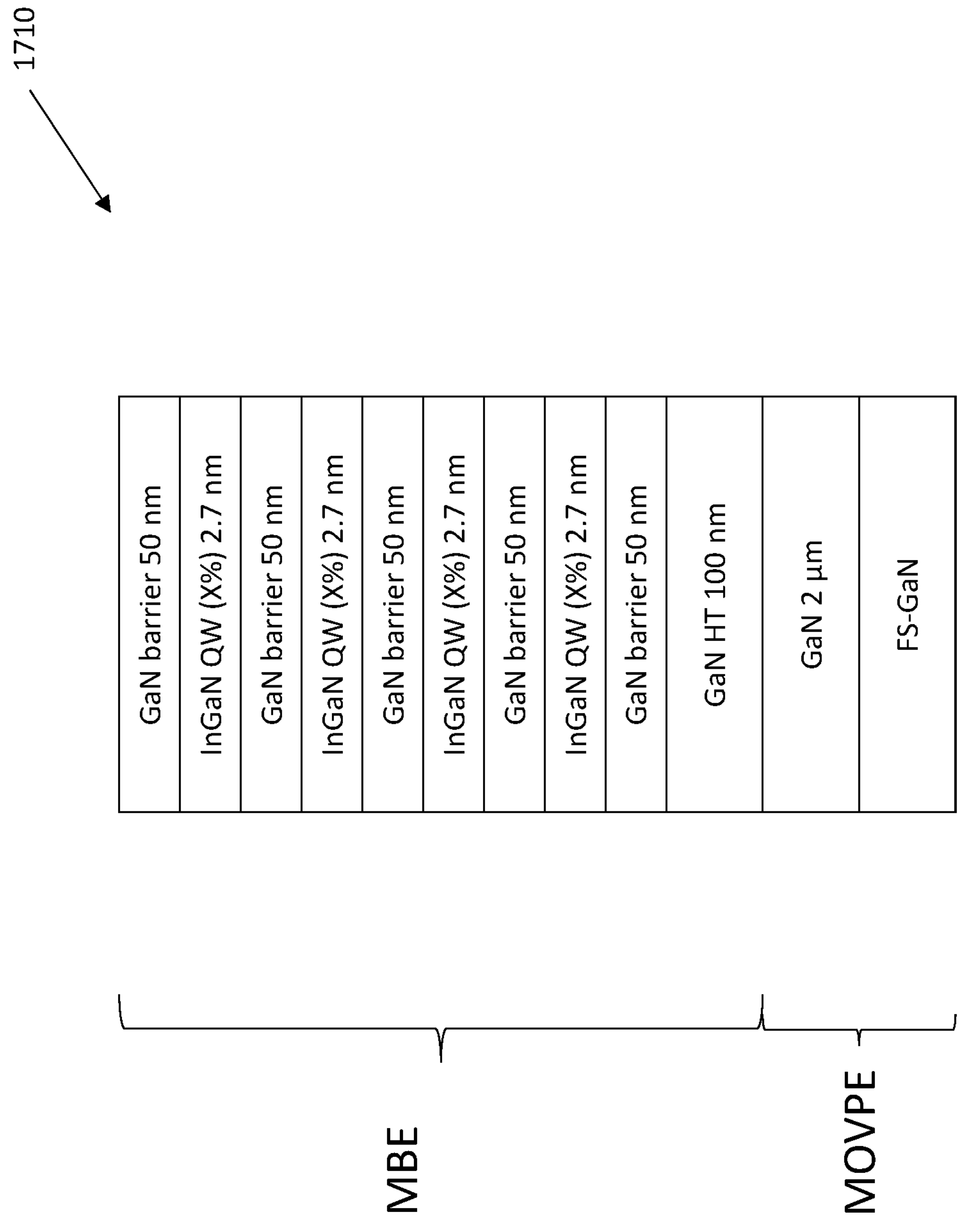
FIG. 17A is an example epitaxial layer stack of an LED structure with a light-emitting regions having 50 nm thick GaN barriers and 2.7 nm thick InGaN QWs grown with standard plasma conditions.

FIG. 17A is an example epitaxial layer stack 1710 of an LED structure with a light-emitting regions having 50 nm thick GaN barriers and 2.7 nm thick InGaN QWs (having In % of about 12%) grown with standard plasma conditions. MBE was used to grow the light-emitting region, with approximately 10 second interruptions between the growth of barriers and QWs and also to grow, at high temperature, a 100 nm thick layer GaN below the light-emitting region. An underlying structure having a two micrometer thick GaN layer and a free-standing GaN staircase electron injection (SEI) layer was grown using metal-organic vapor phase epitaxy (MOVPE) before the MBE-grown layers were grown.

Figure 17B:
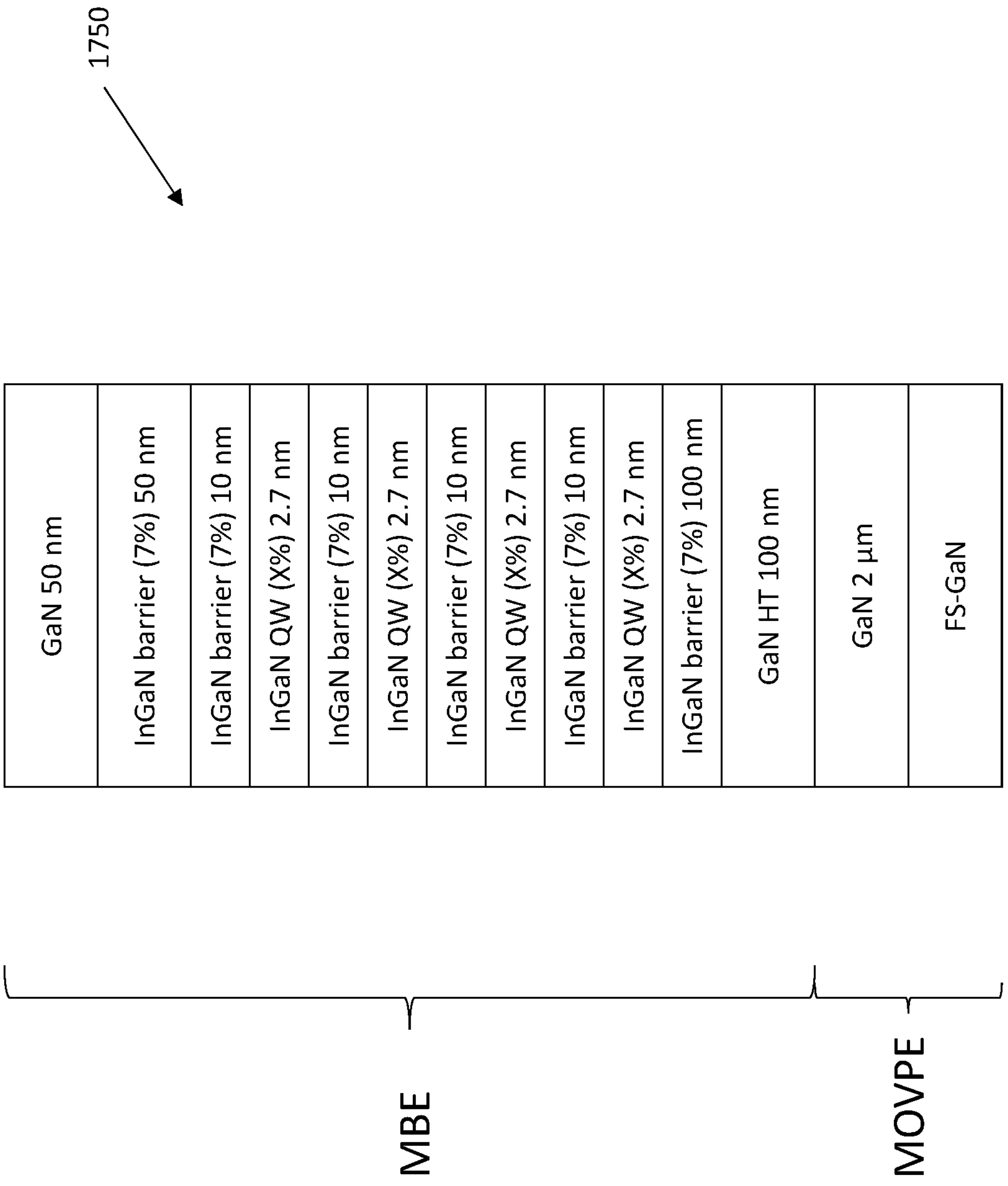
FIG. 17B is an example epitaxial layer stack of an LED structure with a light-emitting regions having 10 nm thick InGaN barriers with IN %=7% and 2.7 nm thick InGaN QWs grown with molecular N-rich plasma conditions and with no interrupts between the growth of adjacent barriers and QWs.

FIG. 17B is an example epitaxial layer stack 1750 of an LED structure with a light-emitting regions having 10 nm thick InGaN barriers with In %=7% and 2.7 nm thick InGaN QWs with In %=12% grown with molecular N-rich plasma conditions and with no interrupts between the growth of adjacent barriers and QWs. MBE was used to grow the light-emitting region, with no interruptions between the growth of barriers and QWs, and also to grow, at high temperature, a 100 nm thick layer GaN below the light-emitting region. InGaN barriers at the top and bottom extrema of the light-emitting region are 50 nm and 100 nm thick, to provide good morphology between the InGaN light-emitting region and the surrounding GaN layers and to ensure that any interrupts in processing between InGaN and GaN layers occur relatively far from the QW layers. An underlying structure having a two micrometer thick GaN layer and a free-standing GaN staircase electron injection (SEI) layer was grown using metal-organic vapor phase epitaxy (MOVPE) before the MBE-grown layers were grown. MBE was used to grow the light-emitting region and also to grow, at high temperature, a 100 nm thick layer GaN below the light-emitting region. An underlying structure having a 2 micrometer thick GaN layer and a free-standing GaN staircase electron injection (SEI) layer was grown using MOVPE before the MBE-grown layers were grown.

Figure 18:
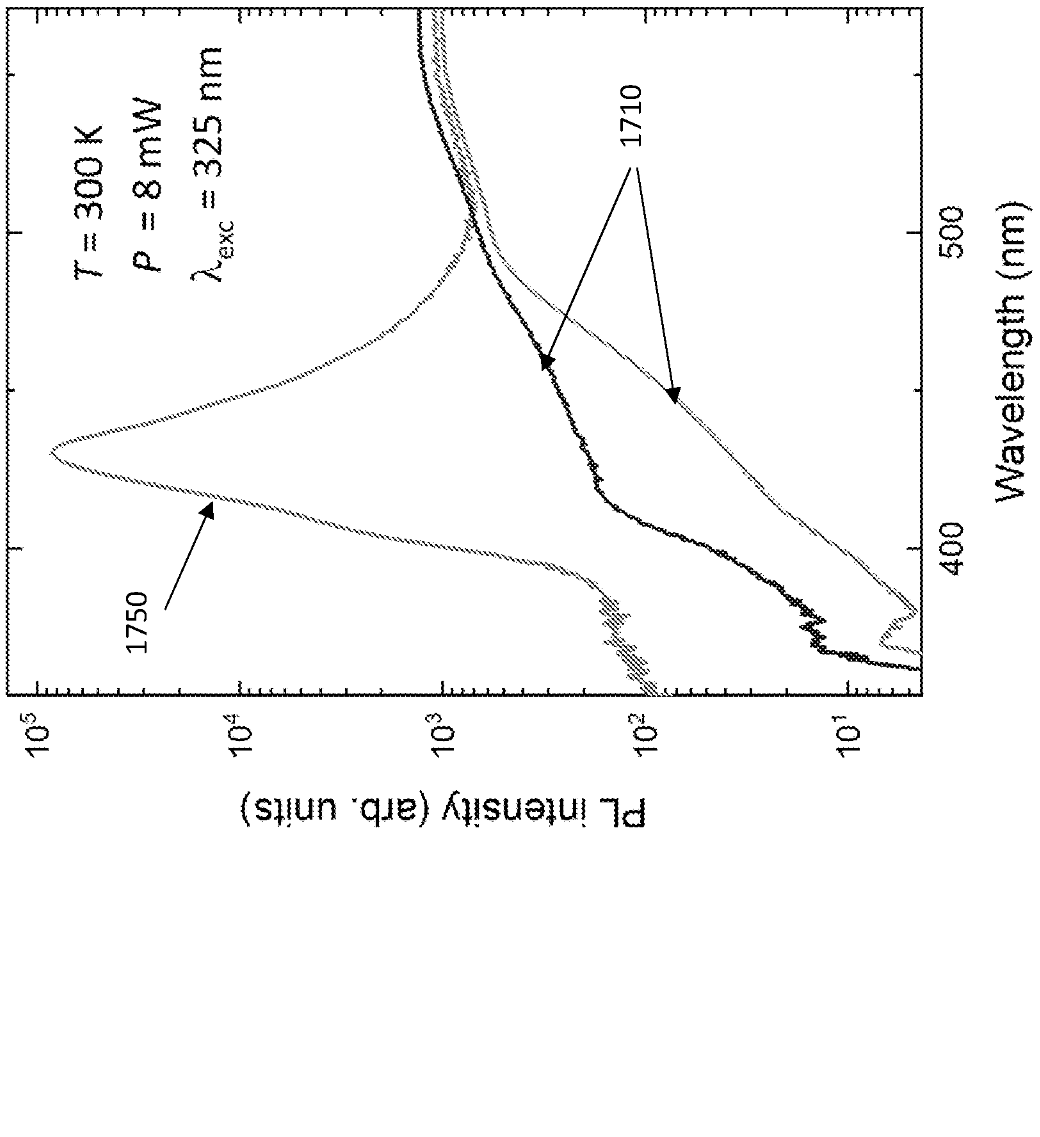
FIG. 18 is a spectral graph that shows the PL spectra emitted from LEDs when operated at a temperature of 300 K and pumped by 8 mW of 325 nm laser excitation.

FIG. 18 is a spectral graph that shows the PL spectra emitted from these LEDs when operated at a temperature of 300 K and pumped by 8 mW of 325 nm laser excitation. The spectra in FIG. 18 are labeled by the device (1710 or 1750) associated with the spectra. From the spectra in FIG. 18, it is evident that the LED with InGaN barriers grown with molecular N-rich plasma conditions and with no interrupts between the growth of adjacent barriers and QWs has a much brighter photoluminescence, and therefore higher IQE, than the LED with GaN barriers that was grown with interruptions between the growth of the QWs and the barriers under standard plasma conditions.

The indium content and the impurity content of the devices 1710, 1750 at different depths from the surface of the device was measured with a mass spectrometer (e.g., a time-of-flight secondary ion mass spectrometer) to determine the amount of various different impurities in the devices in relation to the different layers of the devices and to discern how impurities may affect the optical performance of the devices.

Figure 19A:
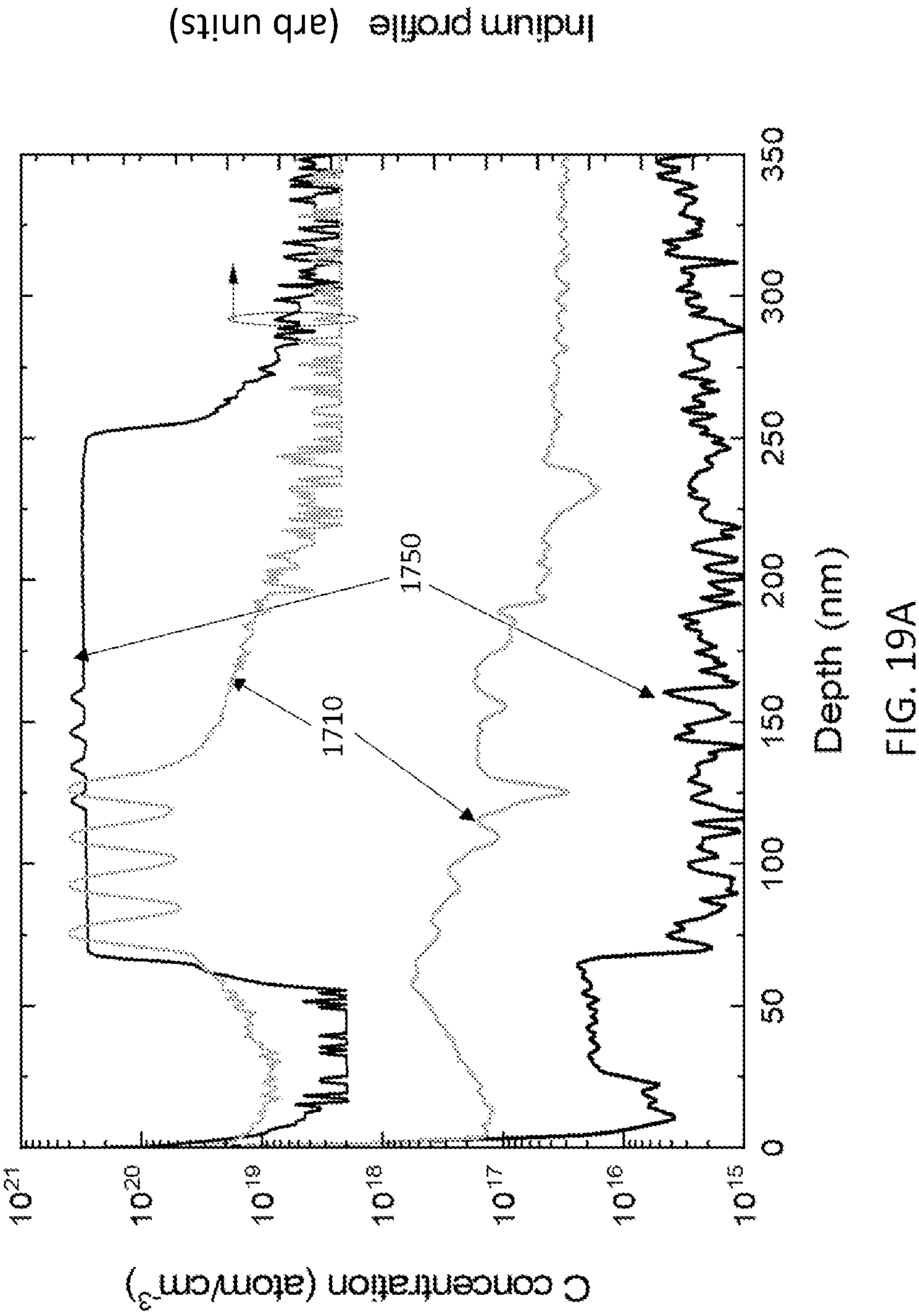
FIG. 19A is a graph of the carbon content (lower traces and left y-axis) and the indium content (upper traces and right y-axis) in LED devices as a function of depth from a surface of the device (on the x-axis).

FIG. 19A is a graph of the carbon content (lower traces and left y-axis) and the indium content (upper traces and right y-axis) in LED devices 1710 and 1750 as a function of depth from a surface of the device (on the x-axis). As seen from FIG. 19A, the standard LED structure 1710 has a higher baseline level of carbon impurity compared to the LED device 1750, which has a carbon concentration below $1\times10^{16}$ $cm^{-3}$, and possibly below the detection limit of $1\times10^{15}$ $cm^{-3}$.

Figure 19B:
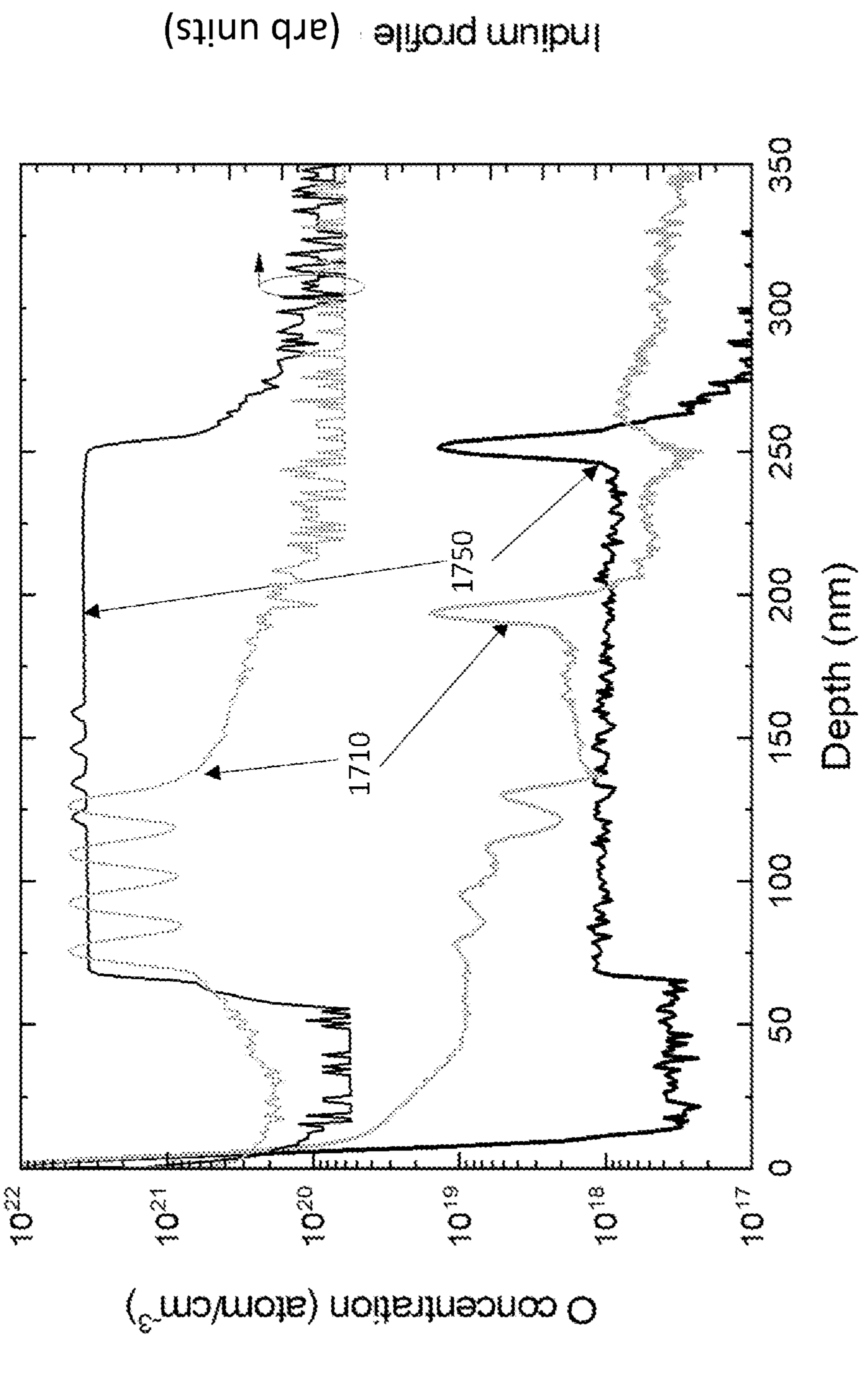
FIG. 19B is a graph of the oxygen content (lower traces and left y-axis) and the indium content (upper traces and right y-axis) in LED devices as a function of depth from a surface of the device (on the x-axis).

FIG. 19B is a graph of the oxygen content (lower traces and left y-axis) and the indium content (upper traces and right y-axis) in LED devices 1710 and 1750 as a function of depth from a surface of the device (on the x-axis). As seen from FIG. 19B, the standard LED structure 1710 has a higher baseline level of oxygen impurity compared to the LED device 1750. In addition, peaks in the oxygen concentration are present in the conventional devices 1710 at depths corresponding to QWs (as seen from comparing In concentration peaks with the oxygen concentration peaks), which may be caused by the growth interrupts between barriers and QWs. The improved structure 1750 has a carbon concentration below $1\times10^{18}$ $cm^{-3}$ and no peaks, as no growth interruptions occur between adjacent QWs and barriers, and oxygen concentration is relatively constant throughout the light-emitting region.

Figure 19C:
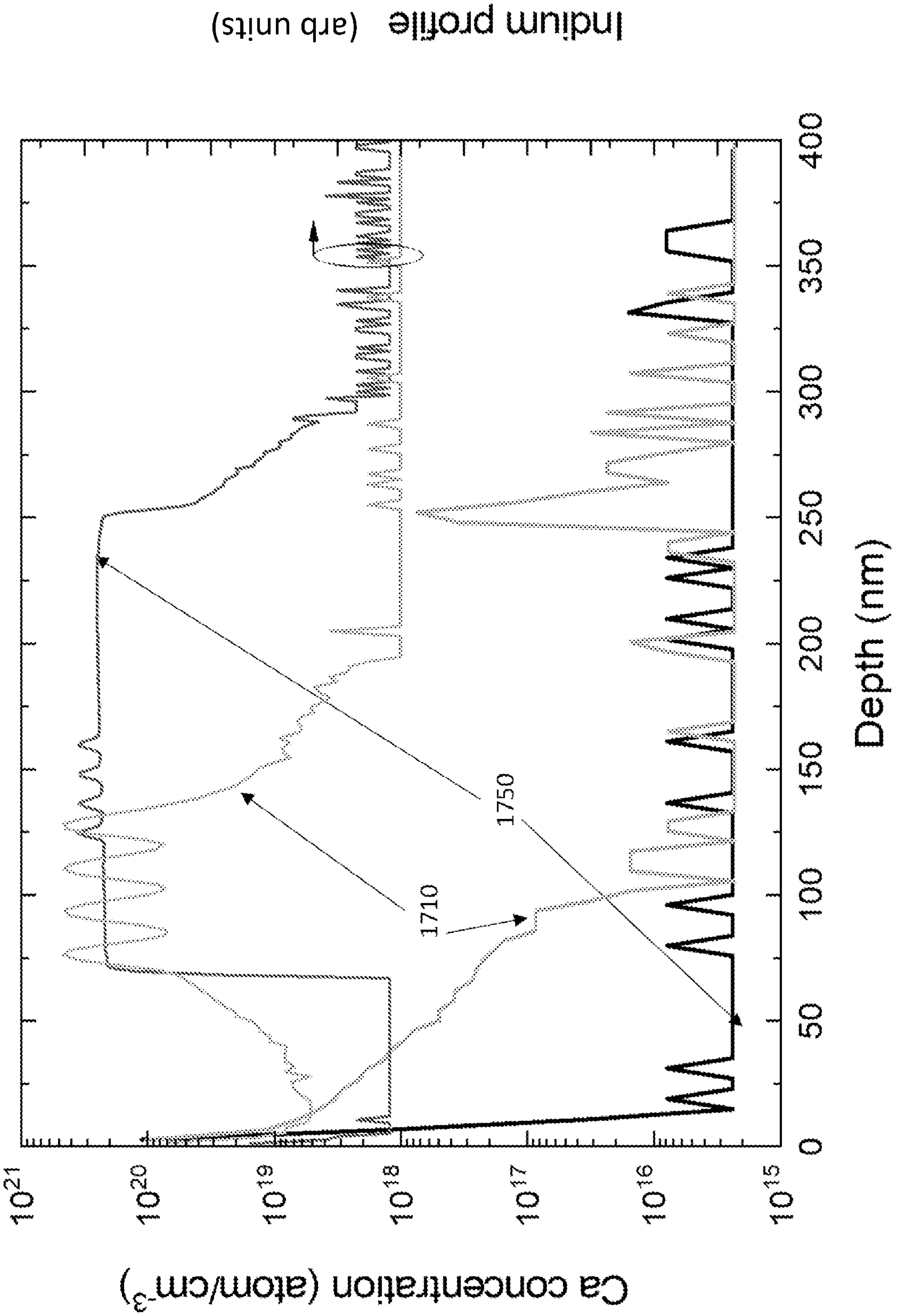
FIG. 19C is a graph of the calcium content (lower traces and left y-axis) and the indium content (upper traces and right y-axis) in LED devices as a function of depth from a surface of the device (on the x-axis).

FIG. 19C is a graph of the calcium content (lower traces and left y-axis) and the indium content (upper traces and right y-axis) in LED devices 1710 and 1750 as a function of depth from a surface of the device (on the x-axis). As seen from FIG. 19C, the standard LED structure 1710 has a higher baseline level of calcium, and Ca peaks appear present at the growth interruption depths. The improved structure has a calcium concentration below the detection limit of $3\times10^{15}$ $cm^{-3}$ everywhere (except near the surface, which is believed to be an artifact).

Figure 19D:
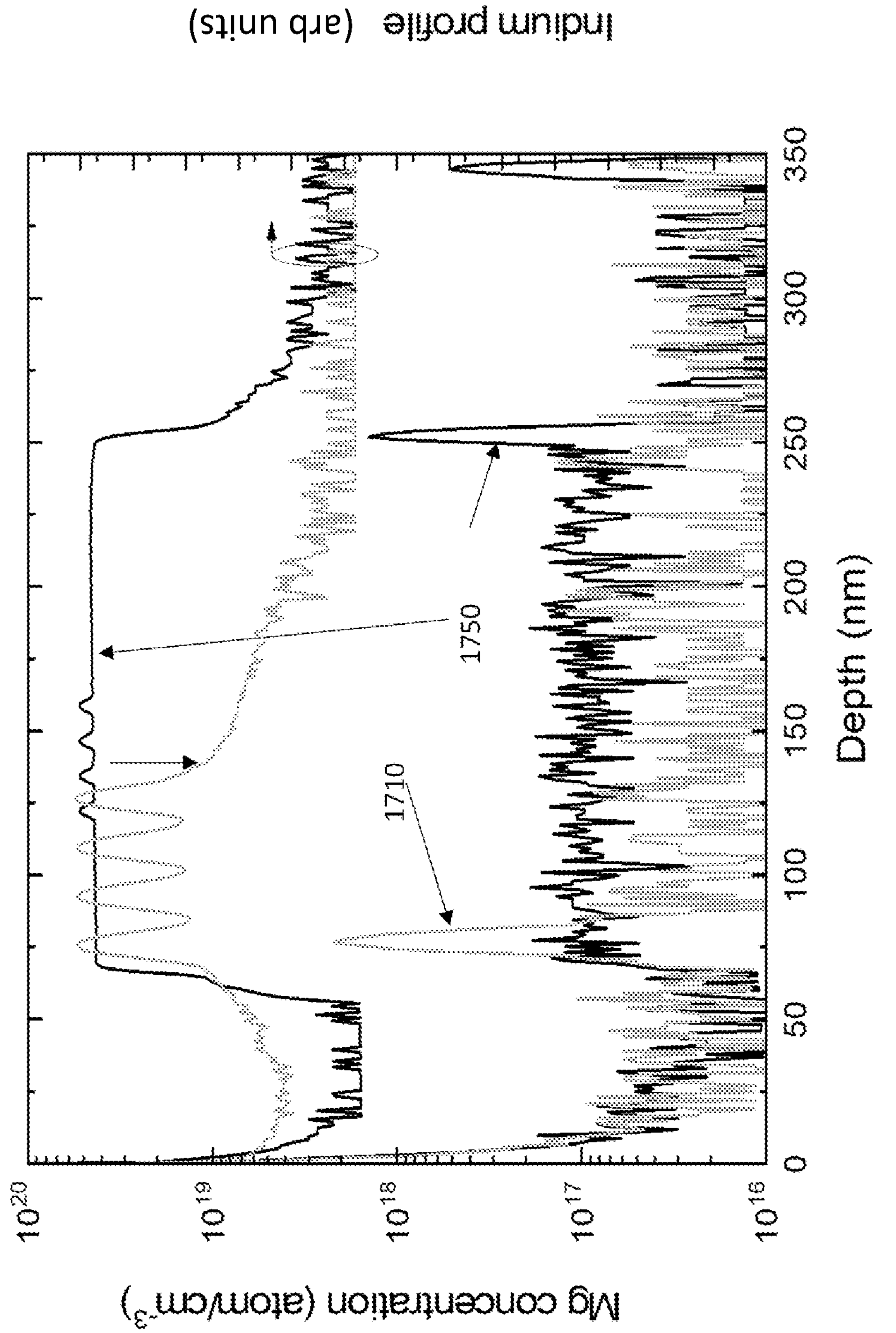
FIG. 19D is a graph of the magnesium content (lower traces and left y-axis) and the indium content (upper traces and right y-axis) in LED devices as a function of depth from a surface of the device (on the x-axis).

FIG. 19D is a graph of the magnesium content (lower traces and left y-axis) and the indium content (upper traces and right y-axis) in LED devices 1710 and 1750 as a function of depth from a surface of the device (on the x-axis). As seen from FIG. 19D, the standard LED structure 1710 has a peak of magnesium at the depth of the QW closest to the surface of the device, whereas the improved structure 1750 does not show such a peak and has a relatively constant Mg concentration of about $1\times10^{17}$ $cm^{-3}$ throughout the active region.

Figure 19E:
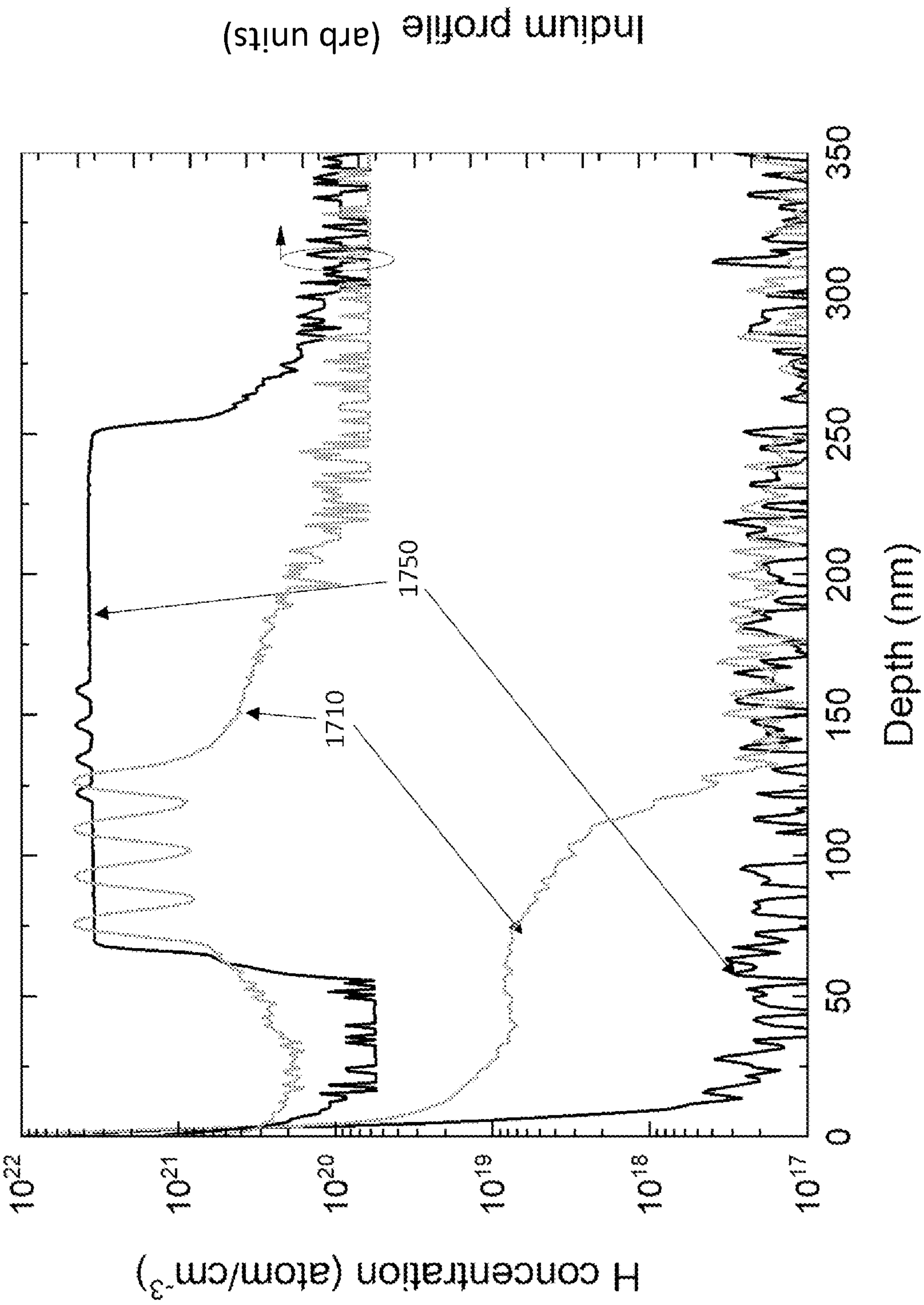
FIG. 19E is a graph of the hydrogen content (lower traces and left y-axis) and the indium content (upper traces and right y-axis) in LED devices as a function of depth from a surface of the device (on the x-axis).

FIG. 19E is a graph of the hydrogen content (lower traces and left y-axis) and the indium content (upper traces and right y-axis) in LED devices 1710 and 1750 as a function of depth from a surface of the device (on the x-axis). As seen from FIG. 19E, the standard LED structure 1710 has a higher baseline level of hydrogen than the improved device 1750.

The SIMS measurements presented in FIGS. 19A, 19B, 19C, 19D, 19E indicate that the plasma conditions influence the incorporation of some impurities into the epitaxial layer stack of an LED device. It is possible that the plasma creates defects in the epitaxial structure (including vacancies of N, Ga, In) and that the plasma conditions may influence this mechanism. Accordingly, a plasma with lower power and/or lower ratio of atomic to molecular N may be selected to reduce defect formation. Defects that are created in the layer stack may react with impurities present in the reactor to form complexes (for example, forming vacancy complexes, such as VGa—O, VN—O, VGa—C, VN—C, and others). Therefore, implementations of the techniques of operating a reactor, or of growing an epitaxial layer stack, according to the parameters described herein, can combine two or more of high molecular $N_2$ plasma conditions, an absence of growth interruptions between barriers and QWs, a low presence of impurities in the reactor chamber to achieve a density of one or several selected impurities (including C, O, Ca, Mg) in the active region that are below a predetermined value, such as $1\times10^{18}$ $cm^{-3}$ (or $1\times10^{17}$ $cm^{-3}$, or $1\times10^{16}$ $cm^{-3}$).

In some implementations, epitaxial reactors (including MBE reactors) are provided, which implement the techniques described here, and that produce devices produced by such reactors.

Conventional MBE reactors may suffer from a trade-off between species flux and uniformity of flux over the wafer on which the LEDs are grown. If a material source (e.g., an MBE cell) is close to a wafer, the flux from the cell onto the wafer can be high, but the uniformity of the flux over the surface of the wafer may be poor, because the flux varies approximately with $1/r^2$ where r is the source-wafer distance, and r is not constant across the surface of the wafer. Uniformity can be improved if r is increased (e.g., to make the flux roughly constant across the wafer), but the flux of material onto the wafer is decreased at the same time, because of the increase in r.

Implementations can include reactors configured to provide a relatively high flux of a species (e.g., a nitrogen species), where the flux is relatively constant across a surface of a wafer that has a diameter (or characteristic lateral dimension perpendicular to a direction between the source and the wafer) of at least 10 cm (or 5 cm, or 15 cm, or 20 cm), and the species flux may vary across the wafer surface by less than +/−20% (or +/−10%, or +/−5%, or +/−2%, or +/−1%) from an average value. In some implementations, the uniformity may be obtained across a plurality of wafers, rather than over a single wafer. The average flux at the wafer surface may be at least $1\times10^{-5}$ (or at least $1\times10^{-6}$, or at least $5\times10^{-7}$, or at least $1\times10^{-7}$) Torr beam equivalent pressure (BEP).

Figure 20A:
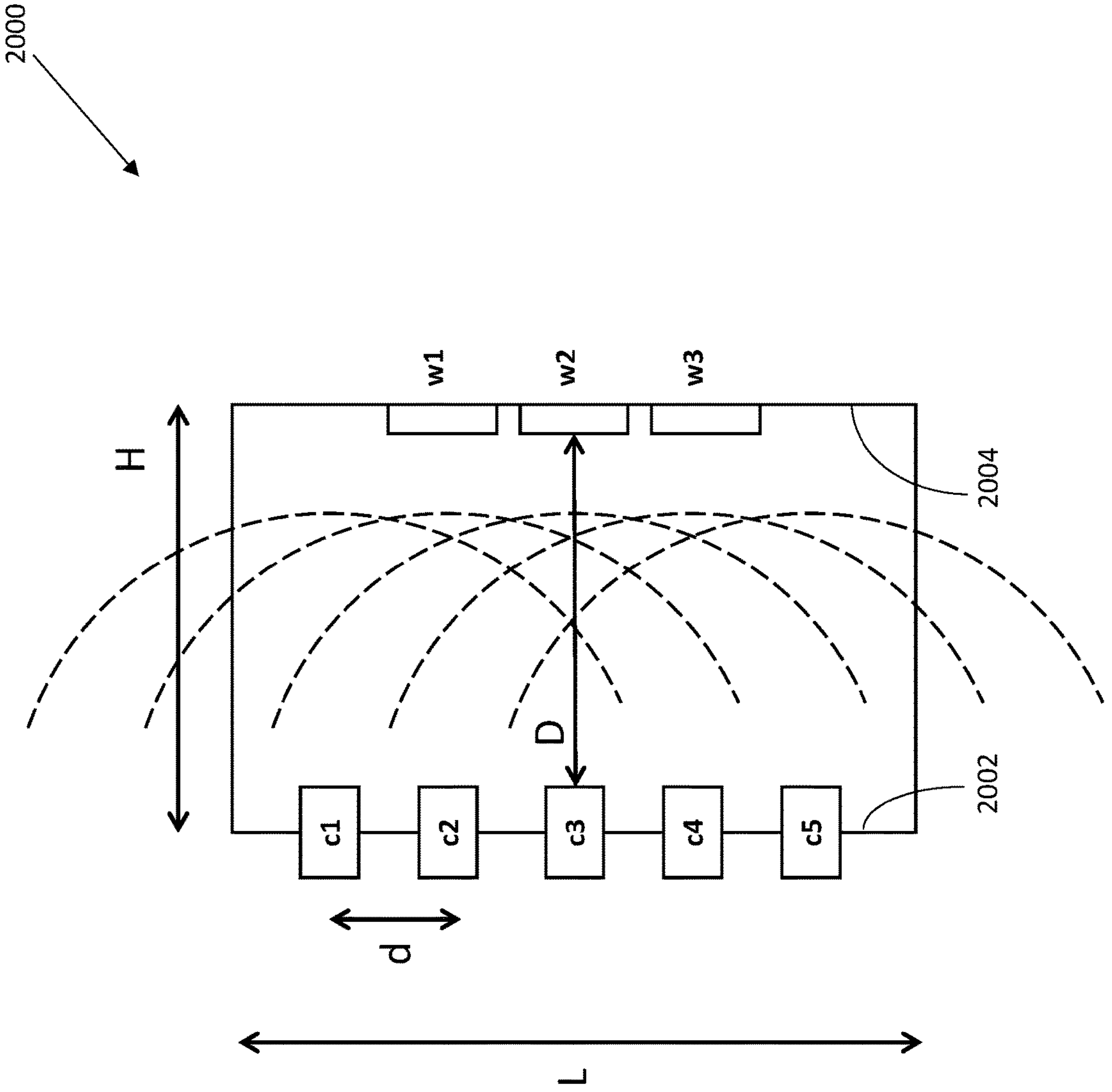
FIG. 20A is a schematic diagram of an example growth chamber that has an approximately cylindrical shape, with a characteristic lateral dimension L (e.g., a diameter) and a characteristic height H.

To provide a substantially uniform flux of a species over the surface of the wafer, the MBE reactor may include a plurality of cells that provide the same species, and the cells can be included in different locations of the growth chamber and/or can emit the species from different locations within the growth chamber toward the wafer. FIG. 20A is a schematic diagram of an example growth chamber 2000 that has an approximately cylindrical shape, with a characteristic lateral dimension L (e.g., a diameter) and a characteristic height H. In some implementations, the chamber has a 'flat' geometry with L>H (or L>2*H, or L>3*H, or L>5*H), and at least two (or at least 3, or at least 5, or at least 7, or at least 10, or at least 15) cells c1, c2, c3, c4, c5 of the same species can be spread across a first wall 2002 of the chamber opposite to a second wall 2004 of the chamber at which at least one wafer w1, w2, w3 is located (i.e., with the cells c1, c2, c3, c4, c5 on the back side 2002 facing the wafer(s)).

Some implementations of the reactor geometry may include a sufficiently low characteristic distance between cells that provide a flux of molecular N and the wafer, such as less than 50 cm (or less than 40 cm, or less than 30 cm, or less than 20 cm, or less than 10 cm). This may facilitate a high N flux.

In the example geometry of FIG. 20A, L=1.6*H, and five cells c1, c2, c3, c4, c5 that provide a same species are present on the first wall 2002 of the chamber 2000. Three wafers w1, w2, w3 are present on the second wall 2004 of the chamber 2000. The individual fluxes of the species (dashed circles) from the different cells c1, c2, c3, c4, c5 combine to provide a relatively constant total flux profile at the surface of the wafers. FIG. 20A shows a two-dimensional cross-section of the chamber 2000, with the different cells c1, c2, c3, c4, c5 arranged in a one-dimensional line, but the different cells c1, c2, c3, c4, c5 can be arranged in two- or three-dimensional array within the chamber.

Figure 20B:
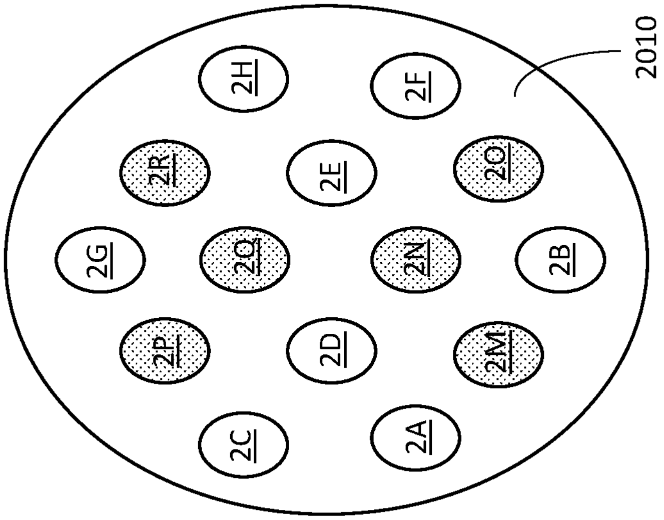
FIG. 20B is a schematic diagram of an end view of an array of multiple cells that provide a same first species and multiple cells that provide a same second species.

FIG. 20B is a schematic diagram of an end view of an array of multiple cells 2A, 2B, 2C, 2D, 2E, 2F, 2G, 2H that provide a same first species and multiple cells 2M, 2N, 2O, 2P, 2Q, 2R that provide a same second species, where the cells are arranged on a wall 2010 of a chamber. The cells may be used to provide multiple types of materials, including Ga, N, In, Al and other species. The cells may be spread out and interspersed with each other on the wall 2010, where the cells 2A, 2B, 2C, 2D, 2E, 2F, 2G, 2H provide a first species and the cells 2M, 2N, 2O, 2P, 2Q, 2R provide a second species. Although cells for providing two species are shown, cells for providing more than two species are possible. A sufficient number of cells that provide a same species located in a spread and interspersed arrangement the wall 2010 may provide the species to a wafer in the chamber with a high degree of uniformity that exceeds a threshold value.

The degree of flux uniformity can be quantified with a simplified model. Referring again to FIG. 20A, a chamber with infinite lateral extent L is assumed, and the first wall 2002 is assumed to include an infinite square periodic array of point source cells, with each cell separated by its nearest neighbors a distance, d. The emission from the infinite number of cells creates an interference pattern that includes minima and maxima of the flux at the second wall 2004. For a constant flux of the species from each of the cells, the flux maxima ($F(D/d)_{max}$) and flux minima ($F(D/d)_{min}$) at targets on the second wall depend on the distance, D, between sources (i.e., outlet apertures of the cells) and targets on the second wall and the distance, d, between nearest neighbor cells. The flux non-uniformity can be quantified by a contrast function $C(D/d)=(F(D/d)_{max}-F(D/d)_{min})/F(D/d)_{max}$. C=1 corresponds to a very high non-uniformity, with the minimum flux dropping to zero, which can be caused if D is small compared to the distances, d, between cells. C=0 corresponds to a perfectly uniform distribution.

Figure 21B:
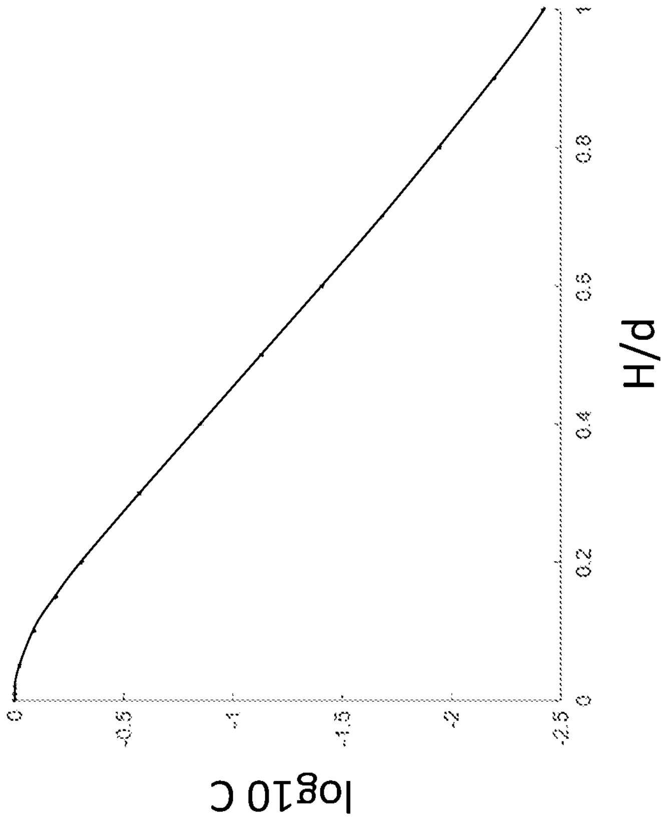
FIG. 21B is a graph of the contrast function C as a function of D/d using a logarithmic scale.
Figure 21A:
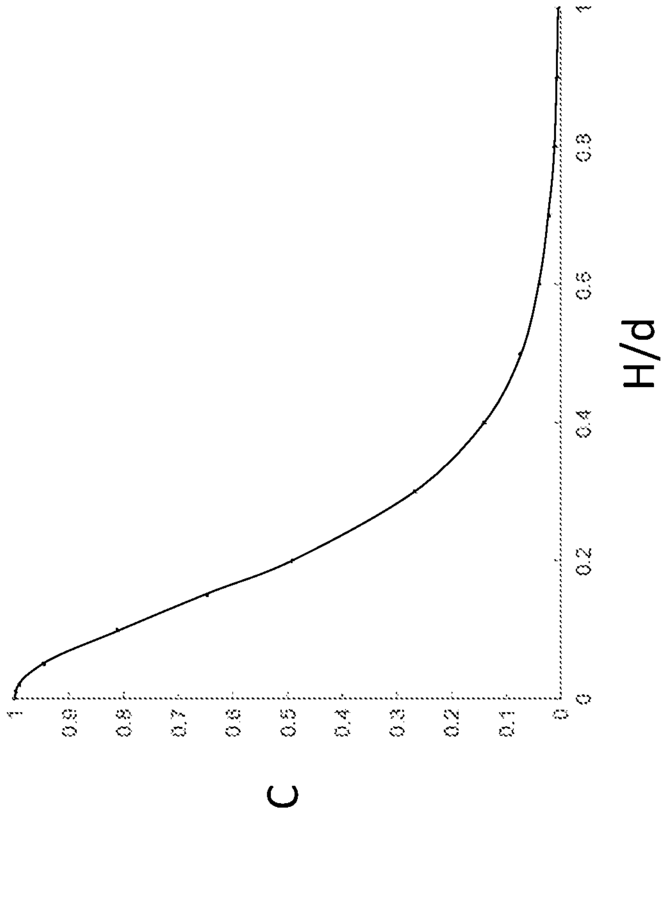
FIG. 21A is a graph of the contrast function C as a function of D/d using a linear scale.

FIG. 21A is a graph of the contrast function C as a function of D/d using a linear scale. FIG. 21B is a graph of the contrast function C as a function of D/d using a logarithmic scale. The contrast decreases as the value of D/d increases. For D/d>0.5, C is below 0.1. For D/d>1, C is below 0.01. Accordingly, to provide a high degree of species flux uniformity to a wafer, in some implementations that include an array of a plurality of cells that provide a same species to the wafer, D/d can be at least 0.5 (or at least 0.7, or at least 1, or at least 1.5, or at least 2, or at least 3, or at least 5), where d is an average distance between nearest neighbor cells and D is a minimum from a cells to the wafer. In some implementations an experimental value of the flux contrast value can be lower than 0.1 (or lower than 0.05, or lower than 0.01).

In some implementations, a homogeneous wafer has a diameter of 200 mm (or 300 mm), and the flux of various species provided to the wafer (including, for example, N, Ga, In, Al) is uniform within +/−10% (or within +/−20%, or within +/−5%, or within +/−1%, or within +/−0.1%) across the surface of the wafer.

The total pressure during growth may be selected to maintain an effusion regime in which the mean free path of species in the chamber is longer than the distance between the cells and the wafer. The pressure may be below $1\times10^{-5}$ Torr (or below $5\times10^{-5}$ Torr, or below $5\times10^{-6}$ Torr, or below $1\times10^{-6}$ Torr). The pressure may be selected in a range to be high enough to reduce defects, while remaining low enough to maintain the effusion regime. It may be in a range $1\times10^{-5}$ to $1\times10^{-4}$ Torr (or $5\times10^{-5}$, or others).

To investigate the effect of impurities in the MBE reactor growth chamber on the efficiency of an LED produced in the reactor, $NH_3$ was intentionally introduced into the reactor before growing a sample, where it adsorbed onto interior surfaces of the growth chamber. The residual $NH_3$ adsorbed in the reactor evaporated during growth of the LED (as confirmed by mass spectrographic measurements of the background vacuum in the chamber), causing integration of H in the crystal LED structure grown in the $NH_3$-rich and the $H_2$-rich environment.

Subsequently, the inner surfaces of the growth chamber were baked at high-temperature to remove adsorbed $NH_3$ from surfaces of the growth chamber. Bake temperatures of greater than 120° C., greater than 150° C., greater than 200° C., or greater than 250° C. can be used. Then, a second LED was grown in the reactor in the environment having a much lower presence of $NH_3$ and $H_2$. Mass spectrographic measurements of the background vacuum in the chamber confirmed that the partial pressures of $NH_3$ and $H_2$ when the LED was grown were about an order of magnitude lower than before the bakeout process.

Figure 22:
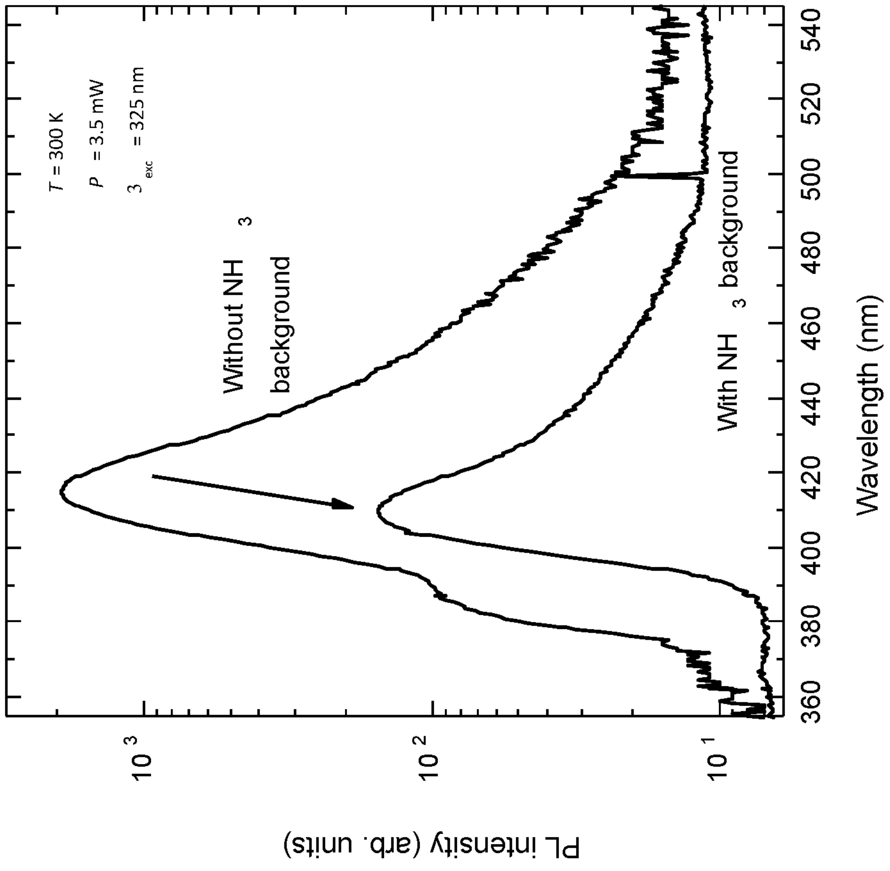
FIG. 22 is a spectral graph that shows the PL spectra emitted from an LED grown in an $NH_3$-rich and $H_2$-rich environment and in an environment that had little $NH_3$ and $H_2$ background when operated at a temperature of 300 K and pumped by 8 mW of 325 nm laser excitation.

FIG. 22 is a spectral graph that shows the PL spectra emitted from an LED grown in $NH_3$-rich and the $H_2$-rich environment (Sample 1) and in an environment that had little $NH_3$ and $H_2$ background (Sample 2) when operated at a temperature of 300 K and pumped by 8 mW of 325 nm laser excitation. From the spectra in FIG. 22, it is evident the PL intensity of Sample 1 is strongly suppressed compared to that of Sample 2, indicating that the presence of background hydrogen may be detrimental to the IQE of an LED, either on its own or by forming complex defects. Sample 2 correspond to a background pressure in the growth chamber (before growth) of $1\times10^{-10}$ Torr, an impinging hydrogen flux on the sample of about $5\times10^{-4}$ monolayers per second, and a H concentration in the grown crystal of about $1\times10^{18}$ to $1\times10^{19}$ $cm^{-3}$.

Some implementations include methods of growing in an MBE reactor with a low background pressure, less than $1\times10^{-10}$ Torr (or $5\times10^{-11}$ Torr, or $1\times10^{-11}$ Torr, or $5\times10^{-12}$ Torr). Some implementations include reactors in which a vacuum within the growth chamber is maintained by one or more cryopumps and/or turbopumps, and/or ion getter pumps. A cryopump may be particularly effective at pumping water vapor and also may reduce the hydrogen partial pressure. Ion getter pumps when operated at high vacuum may be effective at pumping hydrogen gas. The type, number and pump power of the vacuum pumps may be selected, for a given reactor geometry/volume, to achieve a predetermined vacuum level. Some implementations include MBE reactors that can grow LEDs with a hydrogen concentration below $1\times10^{18}$ $cm^{-3}$ (or below $1\times10^{17}$ $cm^{-3}$) in the active region of the LED. In some implementations, a hydrogen concentration in the epitaxial layer stack can be reduced by an annealing step after growth (e.g., thermal annealing). Such provisions may reduce the incorporation of other impurities than hydrogen, including carbon, oxygen, metals. Accordingly, some implementations exhibit an IQE of at least 20% (or 30%, 40%, 50%), as disclosed in greater details in this disclosure.

Some implementations combine various improvements disclosed herein. This may include a lower background pressure; a plasma with an optimized atomic/molecular ratio; a low concentration of a species/impurity; a sufficient flux of a species, including N and/or group-III species.

In some implementations, the formation of defects related to nitrogen vacancies can be mitigated by growing the LED structures at high pressure, for instance in an MOCVD reactor. Conventional MOCVD reactors often operate at a pressure in a range 0.1-1 atm, and, in some implementations, the pressure may be at least 5 atm (or at least 1.5 atm, 2 atm, or at least 3 atm, or at least 10 atm, or at least 20 atm, or at least 50 atm). The pressure may be at total gas pressure or a partial pressure of N-containing species (e.g., ammonia). The pressure may be across the growth chamber, or it may be a local pressure measured in close proximity to the wafer. In some implementations, N-containing species are injected near the surface of the growth wafer to obtain a high local pressure. N-containing species may include ammonia, N radicals, reactive N species. Reactions on N-containing species (e.g., cracking of ammonia) may occur near the wafer surface, or at a position separated from the wafer by at least 10 cm (or by at least 100 cm).

Figure 23:
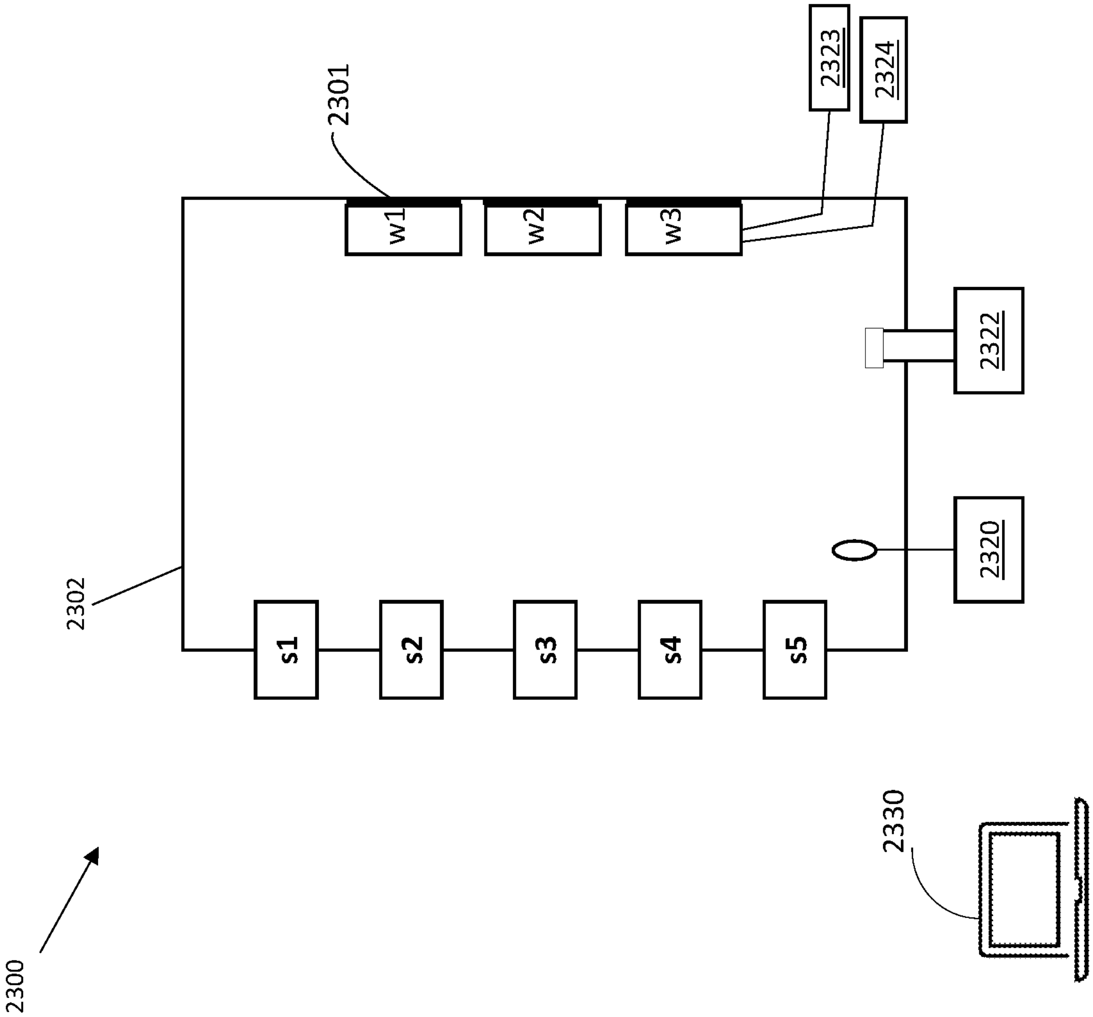
FIG. 23 is a schematic diagram of a system for growing LEDs epitaxially.

FIG. 23 is a schematic diagram of an MOCVD reactor system 2300 for growing LEDs epitaxially. The reactor system 2300 includes a chamber 2302 (also known as a growth chamber) and one or more wafers w1, w2, w3 that provide substrates on which semiconductor layers are grown. The system 2300 can include one or more wafer holders 2301 configured to hold a wafer in place during epitaxial growth. Sources s1, s2, s3, s4, s5 provide materials (e.g., gallium, indium, aluminum, nitrogen, hydrogen, etc.) that are deposited, for example, through MOCVD, on the wafers w1, w2, w3 and/or on layers previously grown on the wafers to create the semiconductor layers of the LEDs. Sources s1, s2, s3, s4, s5 can include a valve to control the flow of material from the source into the chamber 2302 and can include a shutter to close off the flow of all material from the cell to the chamber 2302. Materials from sources s1, s2, s3, s4, s5 can be provide to the wafers w1, w2, w3 to grow devices on the wafers at different times during the growth of the light-emitting layer(s) of the devices and/or from different locations.

The reactor system 2300 can include one or more exhaust chambers 2322 operationally connected to the chamber 2302 and configured to maintain a predetermined pressure in the chamber 2302. The system 2300 can include one or more pressure sensors 2320 configured to measure a pressure in the chamber 2302, where the measured pressure can be used to determine a flux of material from one or more sources s1, s2, s3, s4, s5, which is deposited on the wafers w1, w2, w3. The reactor system 2300 can include one or more heaters 2323 configured to heat a wafer w1, w2, w3 on which an optoelectronic device is grown to a predetermined temperature and one or more temperature sensors 2324 to determine a temperature of the wafer(s) w1, w2, w3, on which the semiconductor layer stack is grown. The reactor system 2300 can include a controller 2330 that includes a memory storing machine-executable instructions and a processor configured to execute the stored instructions, where the execution of the instructions causes the controller 2330 to control the operation of one or more other elements of the system 2300. For example, the controller 2330 can control the flow rate of material from the sources s1, s2, s3, s4, s5 to a wafer w1, w2, w3, can control a temperature of 2324, can control the electrical power applied to electrodes to create a plasma of material, etc.

The reactor 2300 may be configured to retain a high pressure in the chamber 2302. In some implementations, a reactor can include a growth chamber that can be sealed and reach a high pressure and also can be opened to a second chamber (e.g., for loading wafers and accessing the hardware). In some implementations, a load-lock mechanism can be used to separate the growth chamber from the second chamber, so the two chambers can operate at different pressures.

In some implementations, the reactor may be operated only with $NH_3$, i.e., without $N_2$ or $H_2$ carrier gas. The fraction of $N_2$ and $H_2$ may be less than 1% of the total injected gas. In some implementations, liquid $NH_3$ (also known as $LNH_3$) can be used both to carry the precursors and to supply the nitrogen species to the wafer. The use of $LNH_3$ may facilitate a high pressure (on the order of 10 Bars). $LNH_3$ may be flowed in lines that pass through bubblers of metalorganic species (including, for example Trimethylaluminum (TMA), Trimethylgallium (TMG), Triethylgallium (TEG), and Trimethylindium (TMI)) and carry the species that are picked up in the bubblers. Such lines may terminate in a gas injector inside the growth chamber. The $LNH_3$ may then be vaporized in the injector in proximity to the wafer.

In some implementations, the $NH_3$ may be heated in the injector at high temperature to achieve or facilitate its vaporization. In some implementations, this temperature can remain below 600° C. (or below 550° C.) to prevent decomposition of $NH_3$ into gases. In some implementations, the injector can have a temperature between 300° C. and 600° C., or less than 550° C.

In other implementations, the $LNH_3$ can remain relatively cold in the injector, for example below 200° C. (or below 100° C., or below 0° C., or below −50° C., or below −80° C.). In such implementations, the $NH_3$ can be injected in liquid form, and is only heated and vaporized upon arriving on the heated wafer. This facilitates an $NH_3$ decomposition that is very near the surface of the wafer. The corresponding boundary layer of the gas phase may have a thickness less than 1 cm (or 5 mm, 2 mm, 1 mm). The wafer may be held at a temperature enabling cracking of $NH_3$, for example at least 550° C., or higher.

In some implementations, the reactor chamber is equipped to operate at high pressure. The pressure may be at least 1 atm (or at least 1.5 atm, 2 atm, or in a range 1-5 atm or 1-10 atm). The exhaust may be designed to sustain such a high pressure. The reactor may be used in dual mode, with a high pressure (such as 2 atm, or more than 1 atm) in one mode and a lower pressure (such as less than 1 atm) in another mode. For example, high pressure may be used for In-containing alloys, and low pressure for Al containing alloys. The two modes may be practiced in separate chambers (possibly with a load-lock to separate the pressure regions), or in a same chamber having varying pressure.

The pressure in the reaction chamber may be regulated by a device at the exhaust level, which controls the high pressure. For example, the reactor 2300 can include an exhaust chamber through which gases from the reaction chamber are exhausted and the exhaust chamber can meter the exhaust of gases to maintain a total pressure in the reaction chamber above a predetermined value that is greater than two atmospheres. The pressure may be controlled by using valves that prevent or limit the exhaust, and pumps to adjust the pressure. To enable secure operation of high-pressure lines, the lines may be embedded in other lines. The reactor chamber may feature multiple (at least two) exhausts, for example one for the high-pressure regime, one for the low-pressure regime. The two different exhausts may have two types of pumping systems.

The growth chamber and the lines may be embedded in an apparatus to protect the environment from leaks. The susceptor may include holes that surround the wafers where decomposition products can pass through.

The injector may be made of several vaporization nozzles that enable a pressure gradient of $NH_3$ by precisely controlling the local pressure. The hole diameter may control the flow of each injector, with varying hole sizes to achieve a predetermined pressure profile.

In some implementations, an InGaN layer is grown at a high pressure, such as above 1.5 atm (or 2, 3, 5, 10, 20, 50, 100 atm). This may facilitate a low defect density as taught herein, in particular for high-In-content layers, which would otherwise be prone to defect formation, including defects related to N vacancies.

In some implementations, an In-containing layer with a high In % (e.g., greater than 35%) can be grown at a high pressure and a high growth temperature. The high pressure may facilitate the integration of In into the grown crystal, thereby allowing a desired In content in the crystal despite a relatively high growth temperature. This stands in contrast to conventional MOCVD processes (e.g., MOCVD with an operating pressure below 1 atm), where a low temperature may be necessary to achieve a high In content. Some implementations use a growth temperature that is at least 100° C. (or 200° C., 300° C., 500° C.) higher than the stability temperature of the In—N bond at atmospheric pressure (e.g., about 550° C.). The operating gas pressure used at such high temperatures may be sufficient to preclude or limit the dissociation of In—N bonds and to make the In—N bond stable.

In some implementations, an InGaN layer grown at a high pressure can have an In concentration of at least 35% (or 40%, 45%, 50%, 60%) and can be grown at a high temperature of at least 750° C. (or 780° C., 800° C., 820° C., 840° C., 860° C.). Growth at high temperature may be desirable to facilitate a high material quality and high efficiency of the grown device, comparable to the efficiency of standard (blue or green) InGaN QWs, whose IQE can surpass 80%. In some implementations, an InGaN layer grown at high pressure that has an In concentration of at least 35% (or 40%, 45%, 50%, 60%) can have a peak IQE of at least 20% (or 30%, 40%, 50%, 60%, 70%, 80%). The high pressure may be a total pressure that is greater than atmospheric pressure or a partial pressure of a N-containing species (e.g., ammonia), which may limit the formation of defects, including N-vacancy-related defects.

In addition, a high-pressure reactor may be configured to facilitate a laminar gas flow or a quasi-laminar gas flow to avoid a turbulence in the chamber. The reactor geometry, which may be vertical or lateral, may facilitate a thin boundary layer—for instance, by providing a showerhead or gas nozzle close to the wafer, a ceiling close to the wafer, and/or an additional gas flow to push the precursor gases towards the wafer surface. The temperature of the reactor chamber may be lower than the wafer temperature, to limit growth on the surfaces of the reactor chamber. A surface of the chamber may be cooler than the wafer surface by at least 100° C. (or 200° C., 300° C., 500° C.). The flow of precursor gases (such as Ga-, In-, N-carrying gasses, e.g., TMG, TMI, and $NH_3$) may be separated in time (pulsed growth) or in space (separated injection regions).

MOCVD growth at high temperature can lead to operation of the reactor in a thermodynamic-limited regime. In contrast, in some configurations, the combination of a high temperature and a high pressure can maintain operation of the reactor in a mass-transport-limited regime.

A high-pressure-grown epitaxial structure may have the following features. It may include an In(x)Ga(1−x)N-based quantum well layer. It may include In(y)Ga(1−y)N-containing barrier layers for defect reduction, where x and y are percentage values, with y being less than x (e.g. by at least 5%, 10%, 15, 20%). The active region may have x>35% (or 40%, 45%, 50%, 55%, 60%); it may have a thickness less than 3.5 nm (or 3 nm, 2.5 nm, 2 nm). The quantum well layer may be pseudomorphic with underlying layers, and it may undergo partial or full strain relaxation, with a lattice constant that is within 10% (or 20%, 50%) of its bulk/relaxed lattice constant.

Implementations can include methods of improving the IQE of an LED grown at high pressure. For example, a plurality of samples can be grown at varying pressures, each pressure being super-atmospheric (e.g., above 1.5, 2, 3, 5, 10, 20, 50, or 100 atm). In each sample growth, the pressure and other growth parameters (including temperature, gas flows, III/V ratio) can be configured so that a density of a defect is progressively improved, such that the IQE improves by at least 5% (or 10%, 20%) from the first sample to the last sample. The technique may be applied to high-In % active regions, and/or to LEDs emitting at long wavelength (e.g., at least 580 nm, 600 nm, 620 nm, 650 nm) at a predetermined current density (e.g., 1 $A/cm^2$, 10 $A/cm^2$, 100 $A/cm^2$). For example, the grown light-emitting layer can be configured to emit light (e.g., when driven with a current density higher than 1 $A/cm^2$) at a wavelength longer than 600 nm with an internal quantum efficiency higher than 20%.

The techniques described herein can be applied to growth techniques, which may include MBE, MOCVD, plasma-assisted deposition (including remote plasma CVD or radical-enhanced MOCVD), pulsed laser deposition, or other techniques known in the art. Implementations include ensuring an unusually-high nitrogen flow during growth of a layer (in particular, growth of an InGaN-containing layer).

In some implementations a plasma can be created in the growth chamber. The plasma may include a nitrogen ($N_2$) plasma source, providing N species for growth (instead of using ammonia as a N source). This may enable growth at a lower temperature than conventional MOCVD.

In some implementations, this low growth temperature can be used when growing barriers and/or active layers. Some implementations of the grown LEDs may include an In-containing underlayer, which may reduce the defect density in the active layer. This can be followed by growth of a GaN layer with a growth temperature lower than 800° C. (or 700° C., 750° C., 850° C., 900° C., 950° C., 1000° C.). The temperature may be such that a low density of defects (including defects related to N-vacancies) are generated. This is followed by the growth of an In-containing active layer, with a growth temperature lower than 700° C. (or 600° C., 650° C., 750° C., 800° C.). The density of a defect in the In-containing layer may low, as taught herein. The defect may be an SRH-causing defect. It may be a defect related to an N-vacancy, a Ga-vacancy, a Ga—N divacancy.

In some implementations, the use of plasma-assisted epitaxial growth can enable a higher flow of N species when growing an active layer, compared to conventional MOCVD. MOCVD N pressure may be limited by the low cracking of ammonia at low temperature. In contrast, implementations make use of an N plasma source, so that a high N flux can be maintained even at moderate or low growth temperature.

Some implementations combine conventional MOCVD growth and plasma-assisted growth of the In-containing underlayer. For example, some InGaN containing layers can be grown by MOCVD and some layers can be grown by plasma-assisted growth to maintain a low temperature. In some implementations, an In-containing underlayer can be grown by MOCVD; a GaN barrier can be grown at low temperature by plasma-assisted growth to avoid the formation of defects; an In-containing active layer can be grown either by MOCVD or by plasma-assisted PA growth; and additional layers may further be grown.

The techniques described herein may be applied to a variety of semiconductor optoelectronic devices, including LEDs but also laser diodes, superluminescent diodes and other light emitters, and electronic devices (including transistors, RF devices, power electronic devices).

The techniques described herein can be used to obtain a semiconductor material grown, for example, by MBE, for use in an electronic device. MBE may be useful for its very low pressure, which can enable very low defect density. For example, a concentration of an unwanted species (e.g., oxygen, carbon, a dopant, or generally an impurity that affects electronic transport or conductivity) in a layer may be below $1\times10^{14}$ per $cm^3$ (or below $1\times10^{13}$ per $cm^3$, below $1\times10^{12}$ per $cm^3$, below $1\times10^{11}$ per $cm^3$, or below $1\times10^{10}$ per $cm^3$). This can be useful in electronic devices, for example, when an undoped layer is sought. Conversely, MBE can be more prone to forming vacancy-related defects or defects near-midgap, as disclosed herein. These may also be problematic for electronic devices, for example, because they facilitate defect-assisted tunneling. Implementations make use of the present teachings to combine a low density of the unwanted impurities with a low density of a vacancy-related defect and/or near-midgap defect.

More generally, implementations include electronic devices (and methods of making them) having a low concentration of an unwanted impurity, and further having a low concentration of a vacancy-related defect and/or near-midgap defect. This may be accomplished by MBE or by other growth techniques as disclosed herein.

In the specification and/or figures, a number of embodiments have been disclosed. The present disclosure is not limited to such exemplary embodiments. The use of the term "and/or" includes any and all combinations of one or more of the associated listed items. Unless otherwise noted, specific terms have been used in a generic and descriptive sense and not for purposes of limitation. As used in this specification, spatial relative terms (e.g., in front of, behind, above, below, and so forth) are intended to encompass different orientations of the device in use or operation in addition to the orientation depicted in the figures. For example, a "front surface" of a mobile computing device may be a surface facing a user, in which case the phrase "in front of" implies closer to the user.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations.

The implementations described herein can include various combinations and/or sub-combinations of the functions, components, and/or features of the different implementations described.

In the above description, numerous details are set forth. It will be apparent, however, to one of ordinary skill in the art having the benefit of this disclosure, that implementations of the disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying," "determining," "calculating," "detecting," "transmitting," "receiving," "generating," "storing," "ranking," "extracting," "obtaining," "assigning," "partitioning," "computing," "filtering," "changing," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Implementations of the disclosure also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one embodiment" or "an implementation" or "one implementation" throughout is not intended to mean the same embodiment or implementation unless described as such. Furthermore, the terms "first," "second," "third," "fourth," etc. as used herein are meant as labels to distinguish among different elements and may not necessarily have an ordinal meaning according to their numerical designation.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present disclosure is not described with reference to any particular programming language. It will be appreciated that a variety of programming languages may be used to implement the teachings of the disclosure as described herein.

The above description sets forth numerous specific details such as examples of specific systems, components, methods and so forth, in order to provide a good understanding of several implementations of the present disclosure. It will be apparent to one skilled in the art, however, that at least some implementations of the present disclosure may be practiced without these specific details. In other instances, well-known components or methods are not described in detail or are presented in simple block diagram format in order to avoid unnecessarily obscuring the present disclosure. Thus, the specific details set forth above are merely examples. Particular implementations may vary from these example details and still be contemplated to be within the scope of the present disclosure.

It is to be understood that the above description is intended to be illustrative and not restrictive. Many other implementations will be apparent to those of skill in the art upon reading and understanding the above description. The scope of the disclosure should, therefore, be determined with reference to the appended claims, along with the full scope of equivalents to which such claims are entitled.

What is claimed is:

1. An apparatus for growing an InGaN optoelectronic device that includes an n-doped layer, a p-doped layer, and a light-emitting layer between the n-doped layer and the p-doped layer, the light-emitting layer including a quantum well layer having an In % of greater than 25%, the apparatus comprising:
- a reaction chamber;
- a wafer holder in the reaction chamber configured to hold a wafer in place at a temperature at least 750° C. during growth of the light-emitting layer of the optoelectronic device;
- a plurality of group III sources configured for providing an indium-containing metalorganic precursor and a gallium-containing metalorganic precursor to the wafer held by the wafer holder during growth of the light-emitting layer of the optoelectronic device; and
- a source of an N-containing species configured for providing the N-containing species to the wafer held by the wafer holder at a partial pressure of the N-containing species at the wafer of greater than 1.5 atmospheres during growth of the light-emitting layer of the optoelectronic device,
- wherein the group III sources and the source of N-containing species are configured for providing the indium-containing metalorganic precursor, the gallium-containing metalorganic precursor and the N-containing species at the wafer.

2. The apparatus of claim 1, further comprising an exhaust chamber coupled to the reaction chamber and configured to maintain a total pressure in the reaction chamber above a predetermined value.

3. The apparatus of claim 1, wherein the source of N-containing species is configured to provide ammonia to the reaction chamber in a liquid phase.

4. The apparatus of claim 1, wherein the indium-containing metalorganic precursor, the gallium-containing metalorganic precursor, and the N-containing species are provided at the wafer at a total pressure of greater than 2.0 atmospheres.

5. The apparatus of claim 1, wherein the source of the N-containing species is configured for providing the N-containing species to the wafer at a temperature of less than 600° C. and at a rate such that the partial pressure of the N-containing species at a surface of the wafer is greater than 1.5 atmospheres during growth of the light-emitting layer of the optoelectronic device when a surface temperature of the wafer is greater than 750° C.

6. A method of growing in a reaction chamber, by MOCVD, an InGaN optoelectronic device that includes an n-doped layer, a p-doped layer, and a light-emitting layer between the n-doped layer and the p-doped layer, the light-emitting layer including an InGaN quantum well layer having an In % of greater than 25%, the method comprising:
- controlling a temperature at a surface of a wafer on which the InGaN optoelectronic device is grown to be at least 750° C. during growth of the light-emitting layer of the optoelectronic device;
- providing an indium-containing metalorganic precursor and a gallium-containing metalorganic precursor into the reaction chamber and to the wafer during growth of the light-emitting layer of the optoelectronic device when the surface temperature of the wafer is greater than 750° C.; and
- providing an N-containing species to the wafer at a rate such that a partial pressure of the N-containing species at the surface of the wafer is greater than 1.5 atmospheres during growth of the light-emitting layer of the optoelectronic device when the surface temperature of the wafer is greater than 750° C.,
- wherein the indium-containing metalorganic precursor, the gallium-containing metalorganic precursor, and the N-containing species are provided at the wafer.

7. The method of claim 6, further comprising metering an exhaust of gases through an exhaust chamber that is coupled to the reaction chamber to maintain a total pressure in the reaction chamber above a predetermined value that is greater than 2.0 atmospheres.

8. The method of claim 7, wherein providing the N-containing species to the reaction chamber includes providing ammonia to the reaction chamber at a temperature of less than 600° C.

9. The method of claim 7, wherein providing the N-containing species to the reaction chamber includes providing ammonia to the reaction chamber in a liquid phase.

10. The method of claim 6, wherein providing the N-containing species to the reaction chamber includes providing ammonia to the reaction chamber at a temperature of less than 600° C.

11. The method of claim 6, wherein providing the N-containing species to the reaction chamber includes providing ammonia to the reaction chamber in a liquid phase.

12. The method of claim 11, wherein providing the N-containing species to the reaction chamber includes providing the liquid phase ammonia to the reaction chamber at a temperature of less than 200° C.

13. The method of claim 6, wherein the grown light-emitting layer is configured to emit light at a wavelength longer than 600 nm with an internal quantum efficiency higher than 20%.

14. The method of claim 6, wherein the light-emitting layer is configured to emit light at a wavelength longer than 600 nm with an internal quantum efficiency higher than 20% when driven with a current density higher than 1 $A/cm^2$.

15. The method of claim 6, wherein providing the N-containing species includes providing the N-containing species such that it forms a boundary layer over the wafer, wherein a partial pressure of the provided N-containing species is over 1.5 atmospheres in the boundary layer.

16. The method of claim 6, further comprising providing at least two of the indium-containing precursor, the gallium-containing precursor, or the N-containing species at different times during the growth of the light-emitting layer of the optoelectronic device.

17. The method of claim 6, further comprising providing at least two of the indium-containing precursor, the gallium-containing precursor or the N-containing species at separate locations in the reaction chamber.

18. An optoelectronic device grown by the method of claim 6.

19. The optoelectronic device of claim 18, wherein the light-emitting layer is configured to emit light at a wavelength longer than 600 nm with an internal quantum efficiency higher than 20%.

20. The optoelectronic device of claim 18, wherein the light-emitting layer is configured to emit light at a wavelength longer than 600 nm with an internal quantum efficiency higher than 20% when driven with a current density higher than 1 $A/cm^2$.

21. The method of claim 6, wherein the indium-containing metalorganic precursor, the gallium-containing metalorganic precursor, and the N-containing species are provided at the wafer at a total pressure of greater than 2.0 atmospheres.

* * * * *